US010535751B2

(12) United States Patent
Yu et al.

(10) Patent No.: US 10,535,751 B2
(45) Date of Patent: Jan. 14, 2020

(54) SELECTIVE SILICON GROWTH FOR GAPFILL IMPROVEMENT

(71) Applicant: Taiwan Semiconductor Manufacturing Co., Ltd., Hsinchu (TW)

(72) Inventors: De-Wei Yu, Ping-tung (TW); Chien-Hao Chen, Chuangwei Township (TW); Pin-Ju Liang, Changhua County (TW); I-chen Yang, Yilan County (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/992,357

(22) Filed: May 30, 2018

(65) Prior Publication Data

US 2019/0371914 A1 Dec. 5, 2019

(51) Int. Cl.
| | | |
|---|---|---|
| *H01L 21/285* | (2006.01) | |
| *C23C 16/56* | (2006.01) | |
| *C23C 16/24* | (2006.01) | |
| *C23C 16/455* | (2006.01) | |
| *H01L 29/78* | (2006.01) | |
| *H01L 29/66* | (2006.01) | |
| *H01L 21/02* | (2006.01) | |

(52) U.S. Cl.
CPC ........ H01L 29/66545 (2013.01); C23C 16/24 (2013.01); C23C 16/56 (2013.01); H01L 21/02664 (2013.01); H01L 21/28525 (2013.01); H01L 21/28556 (2013.01); H01L 21/28562 (2013.01); H01L 29/66795 (2013.01); *C23C 16/45504* (2013.01)

(58) Field of Classification Search
CPC ......... H01L 21/02532; H01L 21/02592; H01L 21/02595; H01L 21/0262; H01L 21/02664; H01L 21/02694; H01L 21/2018; H01L 21/2053; H01L 21/28525; H01L 21/28556; H01L 21/28562; H01L 29/4916; H01L 29/4925; H01L 29/66545; H01L 29/66795; H01L 29/785; C23C 16/24; C23C 16/56
See application file for complete search history.

(56) References Cited

U.S. PATENT DOCUMENTS

| | | | |
|---|---|---|---|
| 2017/0271476 A1* | 9/2017 | Jang ................. | H01L 21/26506 |
| 2019/0103284 A1* | 4/2019 | Yu ..................... | H01L 29/66545 |
| 2019/0103476 A1* | 4/2019 | Yu ..................... | H01L 29/66545 |
| 2019/0318932 A1* | 10/2019 | Yu ..................... | H01L 29/66795 |
| 2019/0319113 A1* | 10/2019 | Yu ..................... | H01L 29/66545 |

* cited by examiner

*Primary Examiner* — Robert G Bachner
*Assistant Examiner* — Molly K Reida
(74) *Attorney, Agent, or Firm* — Slater Matsil, LLP

(57) ABSTRACT

Embodiments disclosed herein relate generally to forming a gate layer in high aspect ratio trenches using a cyclic deposition-treatment process. In an embodiment, a method includes subjecting a substrate surface having at least one feature to a film deposition process to form a conformal film over a bottom surface and along sidewall surfaces of the feature, subjecting the substrate surface to a treatment process to form respective halogen surface layers or respective halogen-terminated layers on the conformal film formed at respective upper portions of the sidewall surfaces, and performing sequentially and repeatedly the film deposition process and the treatment process to fill the feature with the film.

20 Claims, 20 Drawing Sheets

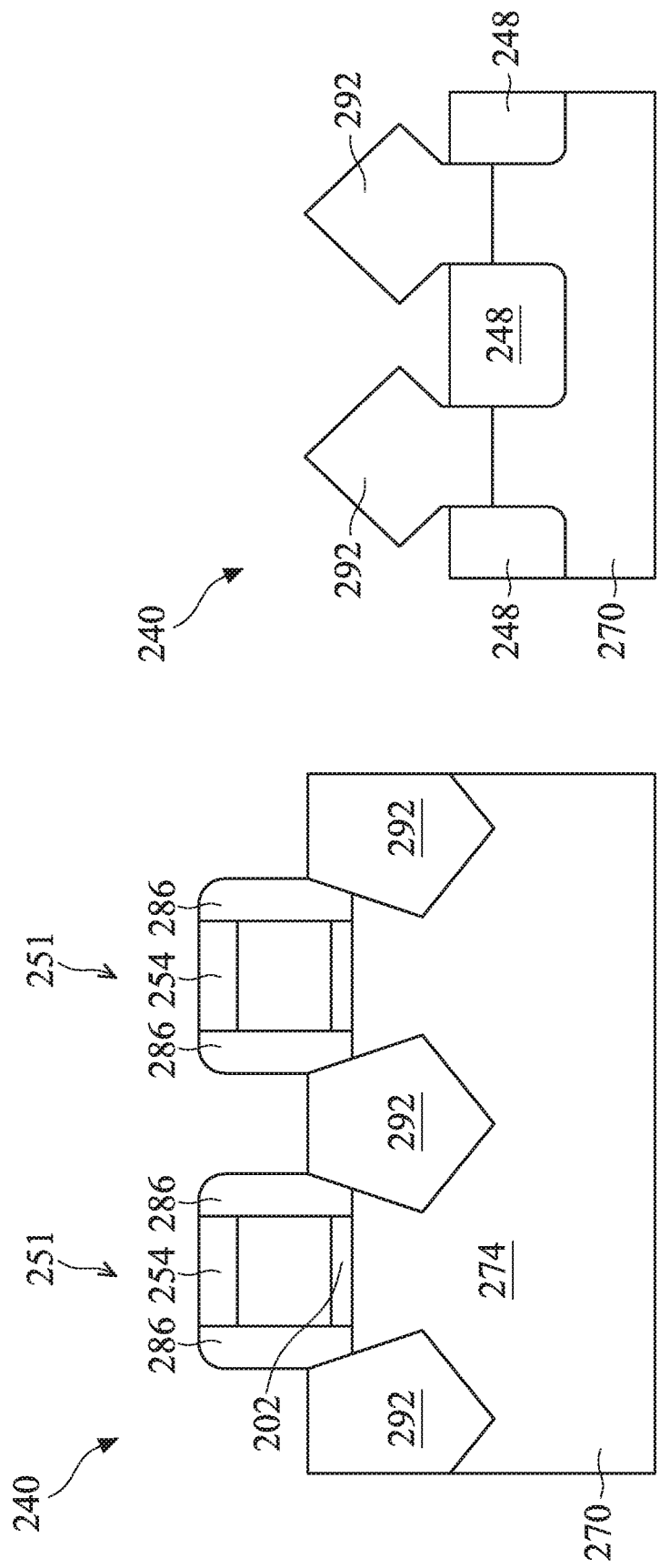

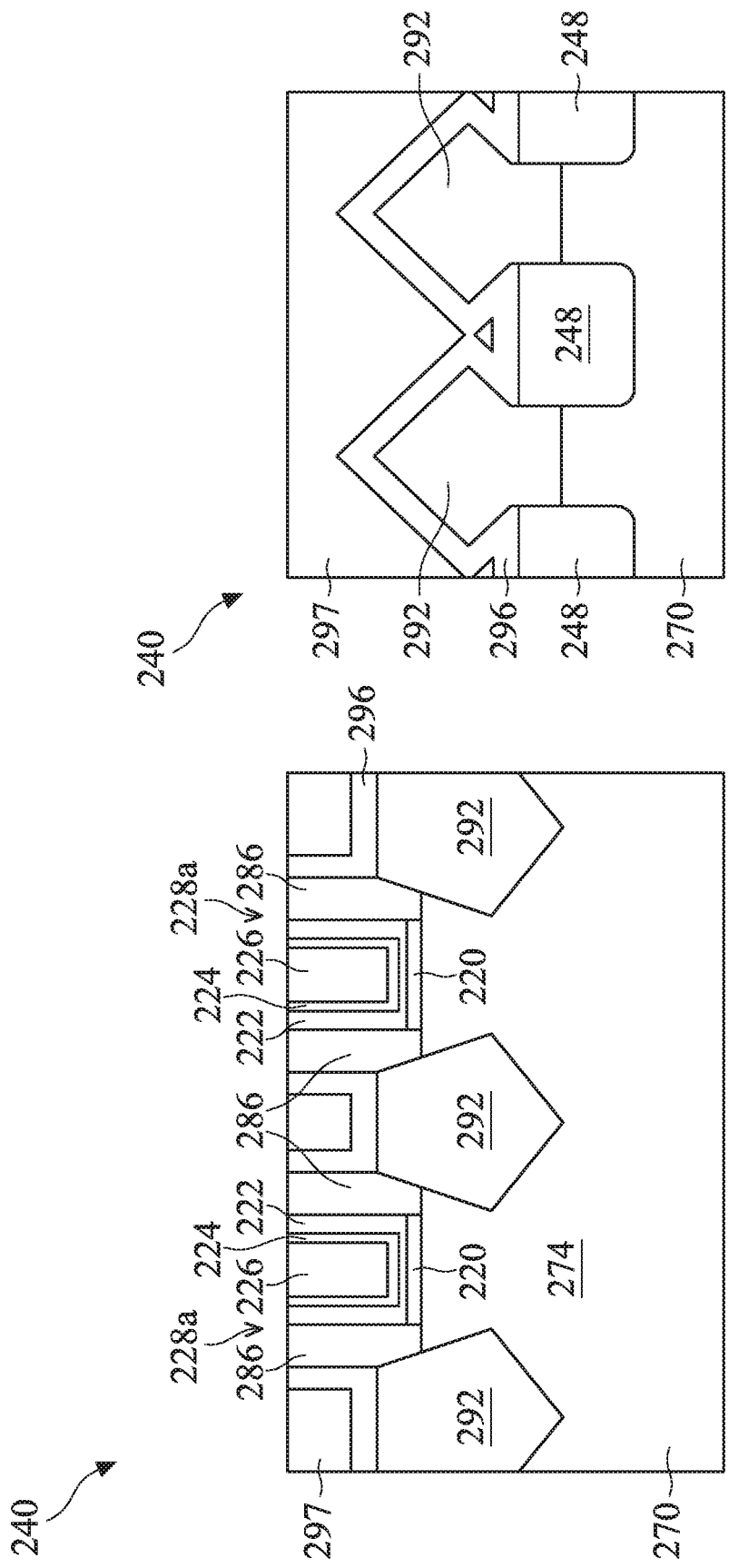

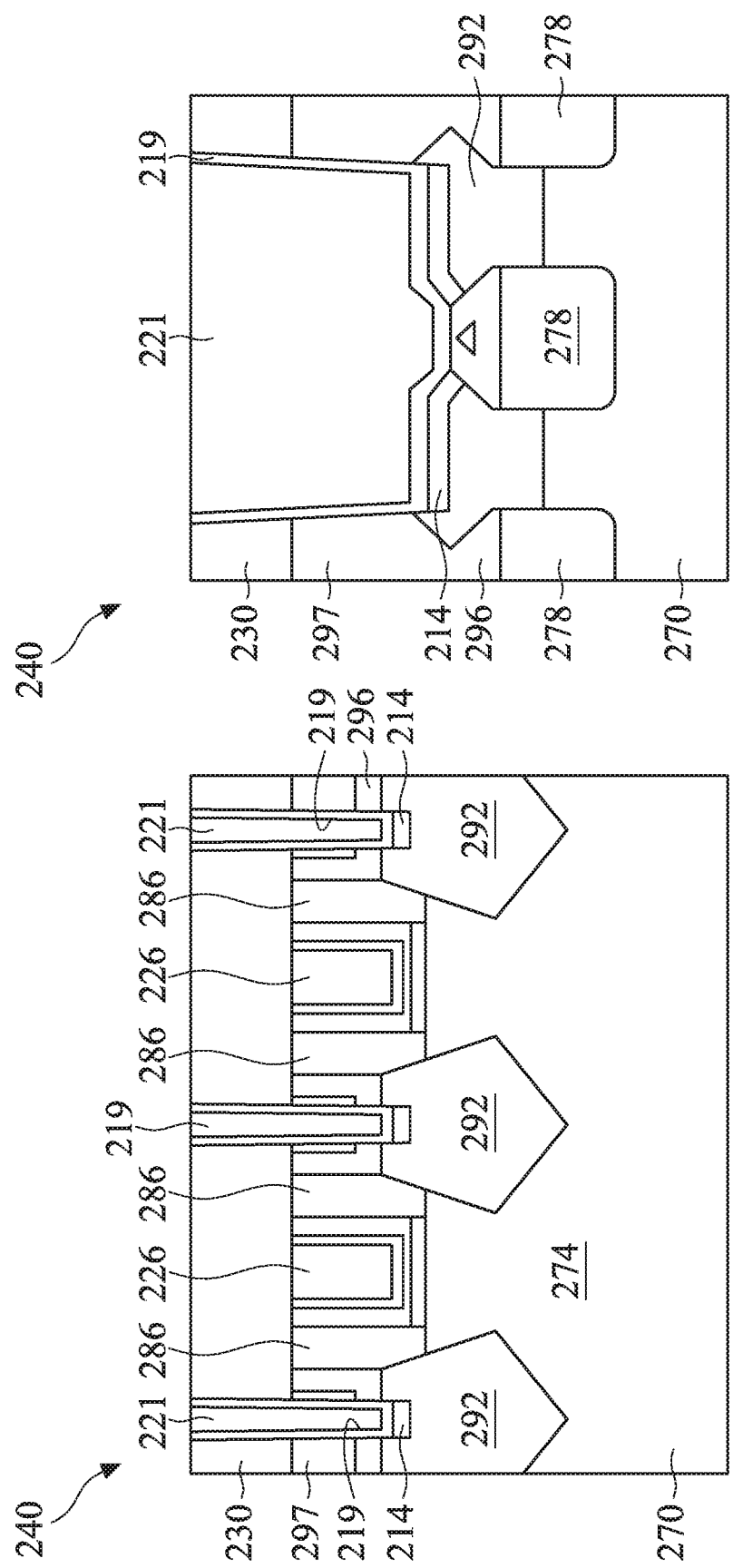

SELECTIVE SILICON GROWTH FOR GAPFILL IMPROVEMENT

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. With the decreasing in scaling, however, it has been challenging to deposit a film in high aspect ratio trenches with small dimension without forming voids or seams.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3 through 13, 14A-14B, 15A-15C, and 16A-16B through 18A-18B illustrate a various schematic three-dimensional and cross-sectional views of an example semiconductor device structure corresponding to various stages of fabrication according to some embodiments.

DETAILED DESCRIPTION

Figure 1:
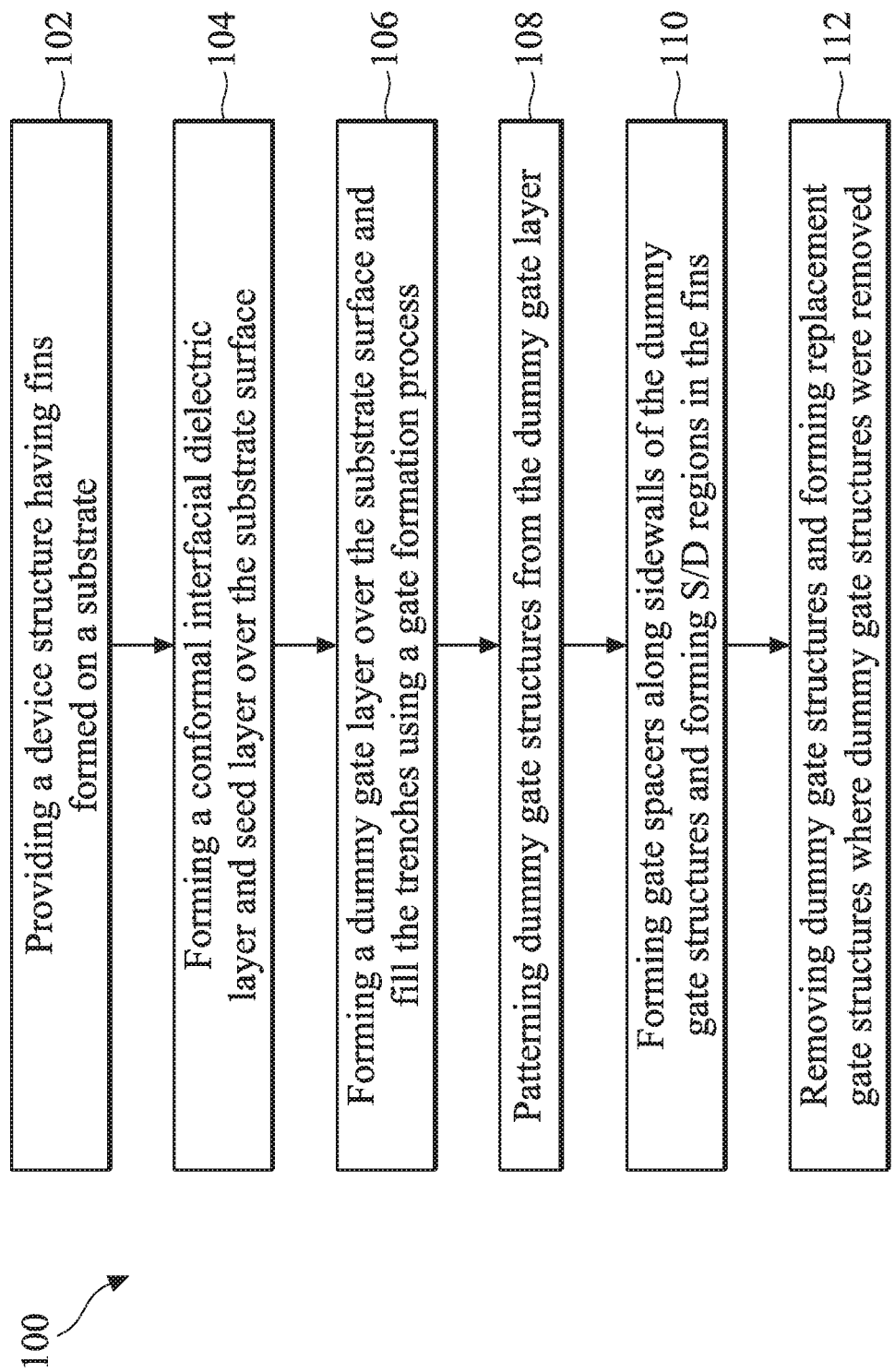
FIG. 1 is a flow chart illustrating an exemplary method for fabricating a semiconductor device structure according to some embodiments.

The following disclosure provides many different embodiments, for examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to depositing a film or layer in semiconductor processing. Embodiments specifically described herein are in the context of depositing a film or layer in trenches between fins, which trenches can be a high aspect ratio. A cyclic deposition-treatment process can include depositing a portion of the film or layer, treating a top portion of the film or layer to passivate the top portion of the film or layer, and repeating the depositing and treating any number of times. The treating can reduce a rate of growth of the film or layer at the passivated top portion during a subsequent deposition such that the cyclic deposition-treatment process can form the film or layer substantially bottom-up in the trench, which can therefore avoid formation of voids or seams in the film or layer in the trench. Aspects of examples described herein can be applied to depositing a film or layer in any trench or recess, which may be a high aspect ratio.

Figure 2:
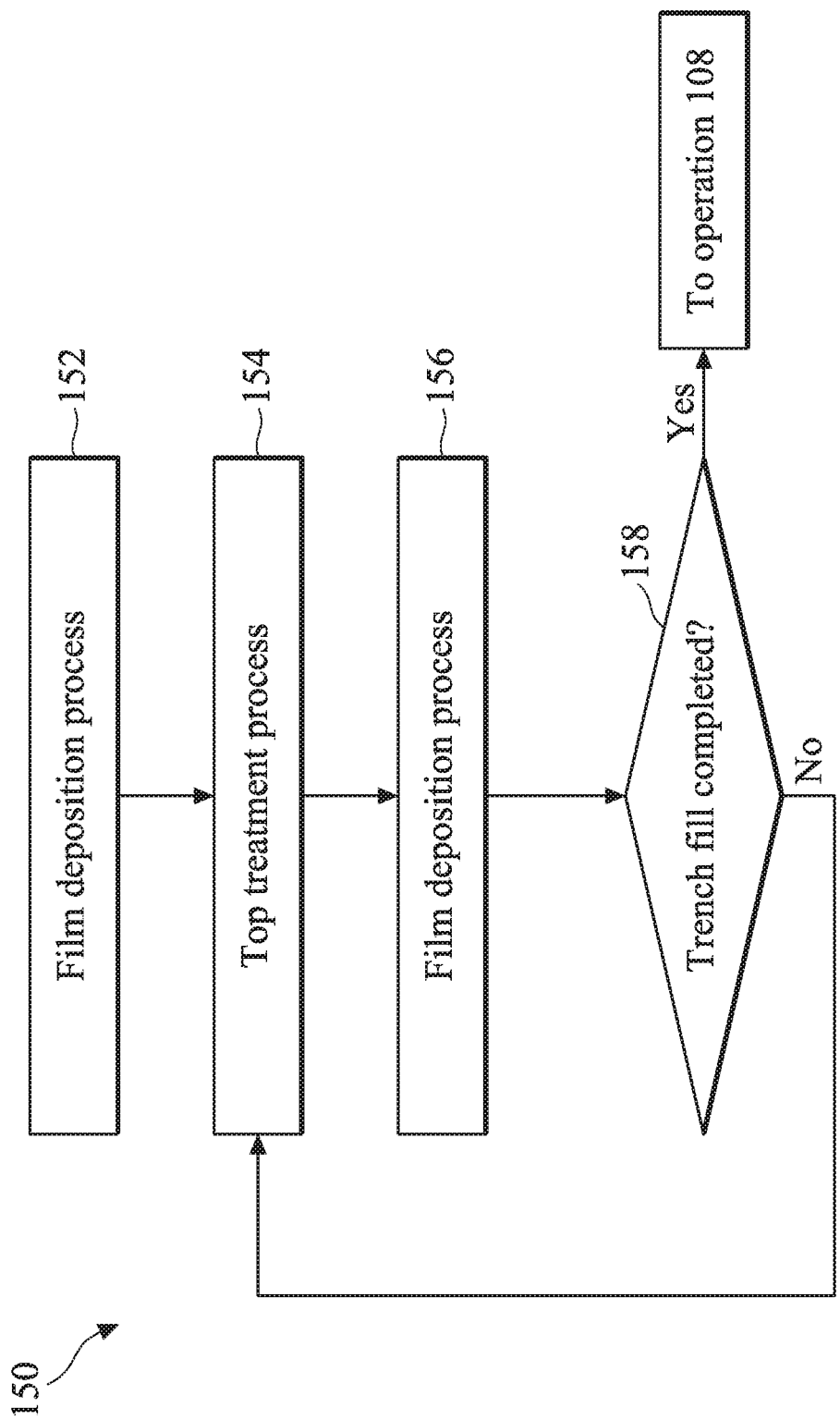
FIG. 2 illustrates an example dummy gate layer formation process according to some embodiments.

FIG. 1 is a flow chart 100 illustrating an exemplary method for fabricating a semiconductor device structure 240 according to some embodiments. FIG. 2 illustrates an example dummy gate layer formation process 150 that can be used during an operation 106 of the flow chart 100 of FIG. 1 according to some embodiments. FIGS. 3 through 13, 14A-B, 15A-C, and 16A-B through 18A-B are schematic three-dimensional and cross-sectional views of a portion of the semiconductor device structure 240 corresponding to various stages of fabrication according to the flow chart of FIG. 1 in accordance with some embodiments. It is noted that the flow chart 100 may be utilized to form any other semiconductor structures not presented herein. Those skilled in the art should recognize that a full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

Figure 3:
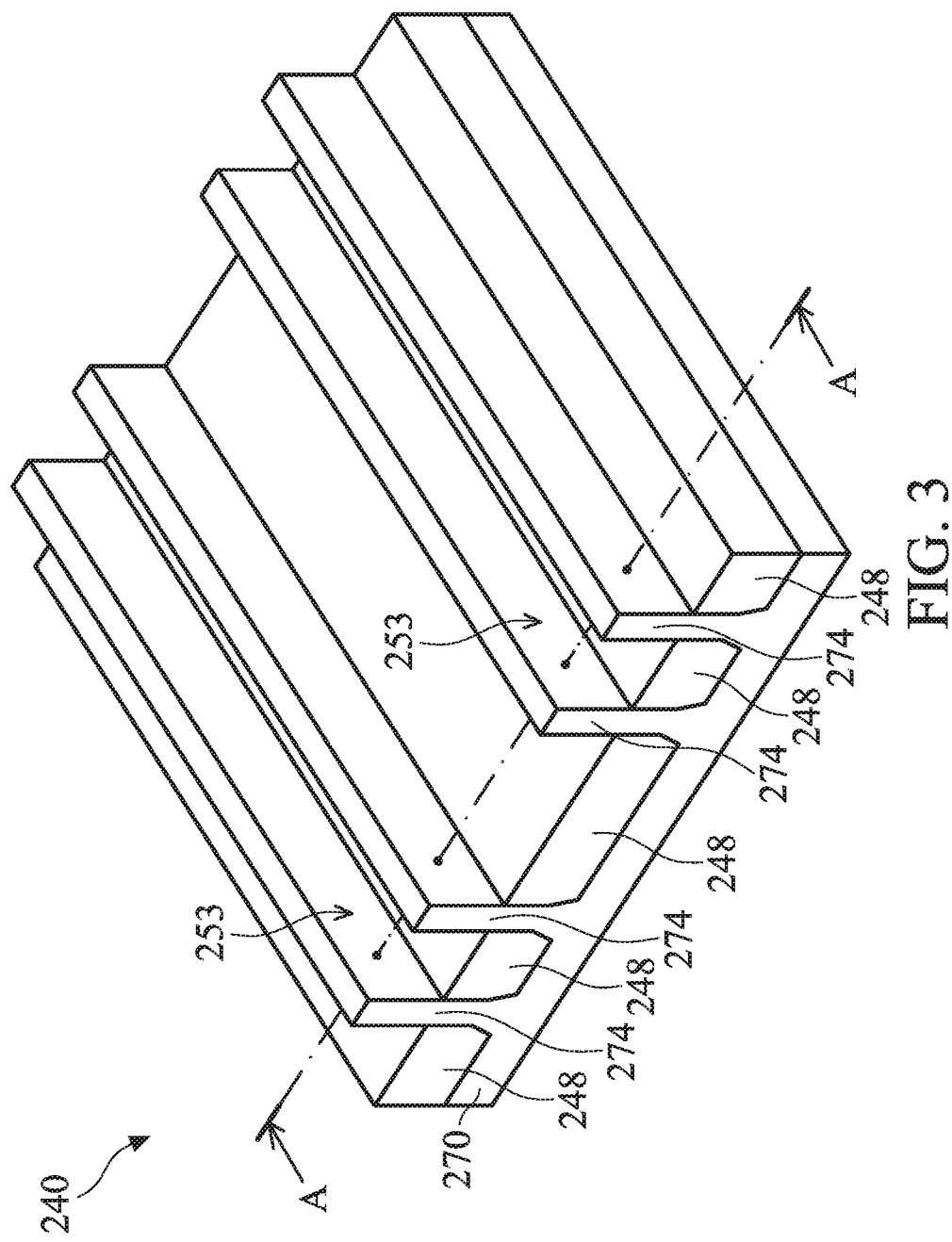

The flow chart 100 begins at operation 102, and further with reference to FIG. 3, by providing a semiconductor device structure 240. The semiconductor device structure 240 has fins 274 formed on a semiconductor substrate 270. The semiconductor substrate 270 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 270 may include an elemental semiconductor including silicon (Si) or germanium (Ge); a compound semiconductor; an alloy semiconductor; or a combination thereof. Each fin 274 provides an active area where one or more devices are to be formed. The fins 274 are fabricated using suitable processes performed on the semiconductor substrate 270, including masking, photolithography, and/or etch processes, to form trenches 253 into the substrate 270, leaving the fins extended upwardly from the substrate 270. The trenches 253 may then be filled with an insulating material. The insulating material may be any suitable dielectric such as an oxide (e.g., silicon oxide), a nitride, the like, or a combination thereof. The insulating material is then recessed, such as by using an acceptable etch process, to form isolation regions 248. The insulating material is recessed such that the top portion of the fins 274 is exposed. The fins 274 protrude above and from between neighboring isolation regions 248.

FIG. 3 further illustrates a cross-section A-A. FIGS. 4 through 13 and 14A illustrate cross-sections of the semiconductor device structure 240 corresponding to the cross-section A-A at various stages of fabrication.

Figure 4:
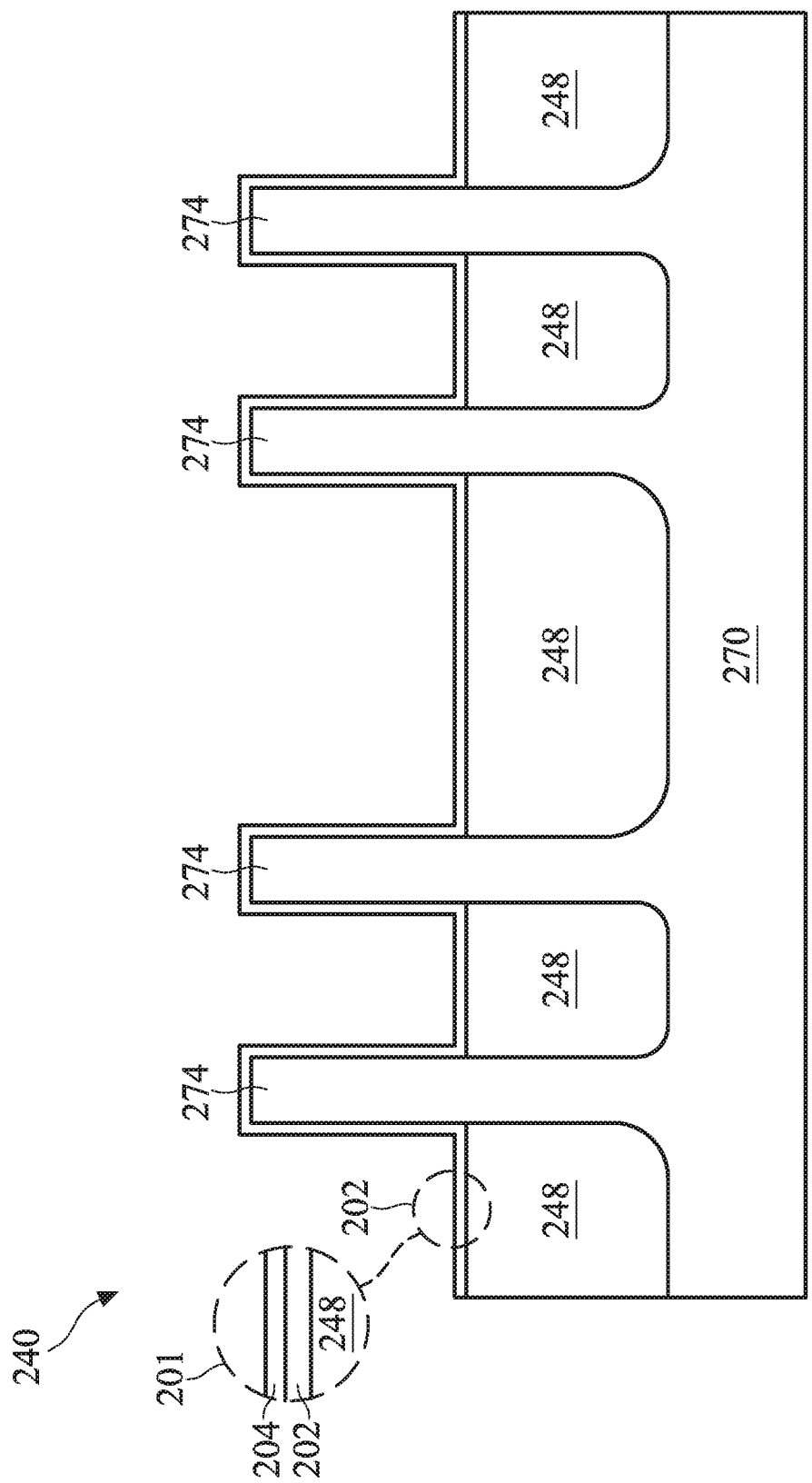

At operation 104, and further with reference to FIG. 4, an interfacial dielectric layer 202 is conformally formed over the substrate 270 to cover the fins 274 and the exposed surfaces of the isolation regions 248. The interfacial dielectric layer 202 may include or be silicon oxide, silicon nitride, the like, or multilayers thereof, and may be thermally and/or chemically grown on the fins 274, or conformally deposited, such as by PECVD, ALD, or any suitable deposition technique. In some embodiments, and further at operation 104, a seed layer 204 may be conformally formed on the interfacial dielectric layer 202. Inset 201 in FIG. 4 is a partially enlarged view showing the interfacial dielectric layer 202 having the seed layer 204 formed thereon. The seed layer 204 is formed on the interfacial dielectric layer 202 to help uniform growth of the subsequent gate on the fins 274 and the isolation regions 248. The seed layer 204 may be chosen depending on the material of the subsequent gate. In some embodiments where the subsequent gate includes silicon (e.g., polysilicon or amorphous silicon), the seed layer 204 may be a silicon-containing film. In such a case, the seed layer 204 can be formed by exposing the substrate surface to a silicon-containing compound to form a solid thin film layer containing silicon on the interfacial dielectric layer 202. The term "substrate surface" in this disclosure is intended to include the exposed surface of a film/layer or partial film/layer that has been deposited onto a substrate, such as the substrate 270, and the exposed surface of the newly deposited film/layer can also become the substrate surface prior to any subsequent process(es). The seed layer 204 may be formed by atomic layer deposition (ALD), chemical vapor deposition (CVD), or any suitable deposition technique. In some embodiments, the seed layer 204 is a silicon layer formed by ALD. Suitable silicon-containing compounds may include, but are not limited to, $(SiH_3)_3N$, $Si[N(CH_3)_2]_4$, $SiH[N(CH_3)_2]_3$, $SiH_2[N(CH_3)_2]_2$, $SiH_3[N(CH_3)_2]$, $SiH_3[N((CH—(CH_3)_2)_2]$, the like, or combinations thereof. In some embodiments, the seed layer 204 is formed using $SiH_3[N((CH—(CH_3)_2)_2]$.

After operation 104, a dummy gate layer is formed over the substrate surface (e.g., over the interfacial dielectric layer 202 and/or the seed layer 204 if used) and fills the trenches 253. Each of the trenches 253 has a bottom surface 255 (e.g., top surface of the isolation region 248) and sidewall surfaces 257 extending upwardly from the bottom surface 255. In various embodiments, the trenches 253 may have an aspect ratio of about 3:1 to about 30:1, such as about 5:1 to about 20:1, for example about 8:1 to about 10:1. The term "aspect ratio" refers to the ratio of the height dimension to the width dimension of a particular feature, for example, trench height/trench width. The trench height substantially equals to the height of the fins 274 protruding above the isolation regions 248 while the trench width substantially equals to the width or distance of the isolation region 248 between two neighboring fins 274.

The film can be any suitable film, such as a film for forming a dummy gate layer. In some embodiments, the film formed is an amorphous silicon film. For gate replacement processes, the dummy gate layer may be formed of polysilicon or amorphous silicon.

A dummy gate layer formation process described herein may deposit a film in high aspect ratio trenches without forming a seam or void. Particularly, the dummy gate formation process can be used to fill features with any suitable aspect ratio (ratio of the depth of the feature to the width of the feature), such as a feature with an aspect ratio equal or greater than 5:1, 10:1, 20:1, 25:1, 30:1, 35:1, 40:1, 50:1, or 100:1. Various embodiments of the dummy gate layer formation process include a cyclic process for depositing a film in high aspect ratio trenches defined between neighboring fins and treating the top portions of the film proximate tops and top sidewalls of the fins with a halogen-containing treatment gas so that the film growth at the top portions of the film proximate tops and/or top sidewalls of the fins is reduced, inhibited, or minimized during the subsequent deposition stage of the cyclic process. Since the film growth at the top portion can be reduced, the film can be selectively grown from the trench bottom and prevent the opening of the trenches from pinching off prematurely and trap a seam or void within the trenches. Therefore, a bottom up filling can be achieved in a seam-free or void-free fashion.

At operation 106, a dummy gate layer formation process is performed to deposit a dummy gate layer over the substrate surface (e.g., exposed surfaces of the interfacial dielectric layer 202 (or the seed layer 204 if used) and fill the trenches 253. FIG. 2 illustrates an example dummy gate layer formation process 150 that can be used during the operation 106 according to some embodiments, and FIGS. 5 to 14A are schematic cross-sectional views of a portion of the semiconductor device structure 240 corresponding to various stages of trench filling according to the flow chart of FIG. 2. The dummy gate layer formation process 150 generally includes a film deposition process 152, a top treatment process 154, and a film deposition process 156. A purge gas such as an inert gas may be flowed into the processing chamber (in which the semiconductor device structure 240 is disposed) between the film deposition process 152, the top treatment process 154, and the film deposition process. For example, the dummy gate layer formation process 150 may include cycles of the film deposition process 152, followed by a chamber purge, followed by the top treatment process 154, followed by a chamber purge, followed by the film deposition process 156, and followed by a chamber purge. The inert gas may be any suitable inert gas such as argon, helium, neon, or any combinations thereof.

The film deposition processes 152, 156 and the top treatment process 154 may be performed in the same or different processing chamber. The deposition-treatment processes can be repeated sequentially and/or alternatingly to gradually fill the trenches 253. After a pre-determined number of sequences or cycles of the deposition-treatment processes, the film formed can fill the trenches, such as the trenches 253 from bottom to top without forming seam or void. This cyclic deposition-treatment processes can be repeated until the complete trench fill is achieved 158 or a desired height of the dummy gate layer is achieved. Thereafter, the flow chart 100 may proceed to operation 108.

Figure 5:
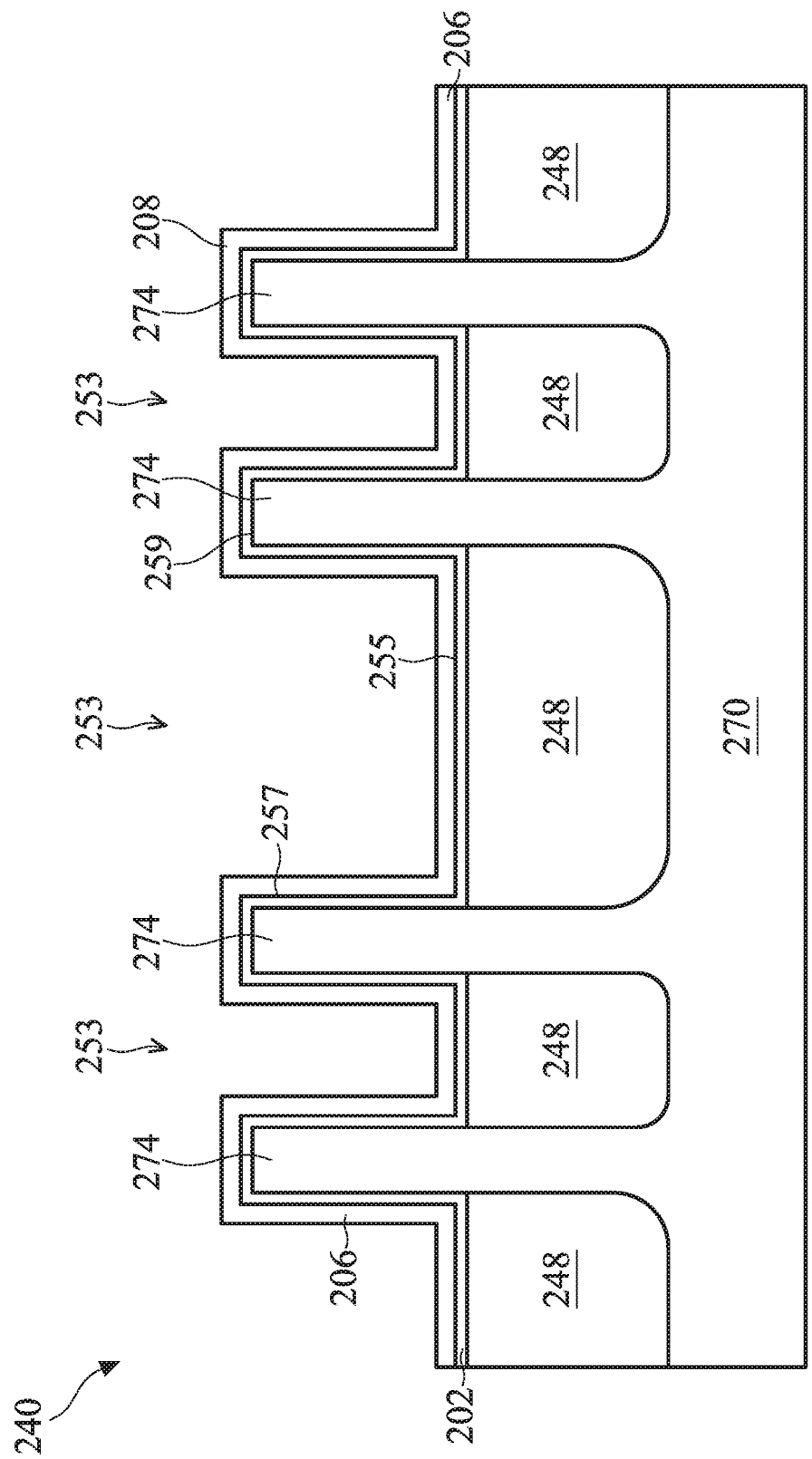

The film deposition process 152 includes forming a film 206 over the substrate surface, as shown in FIG. 5. In some embodiments, the substrate surface may include exposed surface of the interfacial dielectric layer 202 that is conformally formed on fins 274 and the upper surfaces of the isolation regions 248. In some embodiments, the substrate surface may include exposed surface of the seed layer 204 that is conformally formed on the interfacial dielectric layer 202. In various embodiments, the film 206 formed by the film deposition process 152 may include or be any material suitable for a dummy gate layer. Suitable material for the film 206 may include amorphous silicon (a-Si) or polysilicon. In an example, the film 206 formed by the film deposition process 152 is amorphous silicon. Amorphous silicon has been found to be advantageous in filling high aspect ratio trenches for gates because it can provide good etch selectivity with respect to other films (e.g., silicon oxide, amorphous carbon, etc.) in subsequent processes. The film deposition process 152 can be any suitable deposition process including, but is not limited to, low-pressure chemical vapor deposition (LPCVD), chemical vapor deposition (CVD), plasma-enhanced CVD (PECVD), atomic layer deposition (ALD), plasma-enhanced ALD (PEALD), or any suitable deposition technique that can produce a solid phase material on the substrate surface. In some embodiments, the film deposition process 152 is performed using LPCVD. LPCVD may be advantageous in some applications since it can deposit a wide range of film compositions with good conformal step coverage.

The film 206 may be formed by exposing the substrate surface to a silicon-containing precursor. Suitable silicon-containing precursors may include silanes, halogenated silanes, or any combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include, but are not limited to, a chlorinated silane, such as monochlorosilane ($SiH_3Cl$, MCS), dichlorosilane ($Si_2H_2Cl_2$, DCS), trichlorosilane ($SiHCl_3$, TCS), hexachlorodisilane ($Si_2Cl_6$, HCDS), octachlorotrisilane ($Si_3Cl_8$, OCTS), or silicon tetrachloride (STC). In some embodiments, the silicon-containing precursor may use organosilanes which may include compounds with the empirical formula $R_ySi_xH_{(2x+2-y)}$, where R is independently methyl, ethyl, propyl, or butyl, such as methylsilane (($CH_3$)$SiH_3$), dimethylsilane (($CH_3$)$_2$$SiH_2$), ethylsilane (($CH_3CH_2$)$SiH_3$), methyldisilane (($CH_3$)$Si_2H_5$), dimethyldisilane (($CH_3$)$_2$$Si_2H_4$), hexamethyldisilane (($CH_3$)$_6$$Si_2$), tris(dimethylamino)silane (TDMAS), and any combination thereof. In some cases, the silicon-containing precursor may be carbon-free.

Example film deposition process 152 may involve using a LPCVD reactor to process a batch of wafers, such as the semiconductor device structure 240. The wafers are stacked side by side and placed in a boat or cage held in the LPCVD reactor. The reactor is heated and maintained by heating elements of the LPCVD reactor at a temperature in a range from about 120° C. to about 550° C., such as about 200° C. to about 500° C., for example about 250° C. to about 450° C. A silicon-containing precursor, such as $SiH_4$, $Si_2H_6$, $Si_2H_2Cl_2$, $SiHCl_3$, $Si_2Cl_6$, or any combination thereof, may be introduced into the LPCVD reactor from a gas injector located at a sidewall of the LPCVD reactor. In some examples, the silicon-containing precursor includes $SiH_4$ and $Si_2H_6$. The silicon-containing precursor is flowed from the gas injector and laterally across the substrate surface of the semiconductor device structure 240 in a laminar flow-like manner (e.g., parallel to the substrate surface) such that the substrate surface of the semiconductor device structure 240 is exposed to, or in the presence of the silicon-containing precursor. The pressure inside the reactor is maintained at about 20 mTorr to about 4.5 Torr, such as about 0.15 Torr to about 1 Torr, for example about 0.25 Torr, using an exhaust pump and an adjustable exhaust valve. The film deposition process 152 forms the film, e.g., a-Si, over the substrate surface with a thickness of about 10 Angstroms to about 100 Angstroms.

Figure 6:
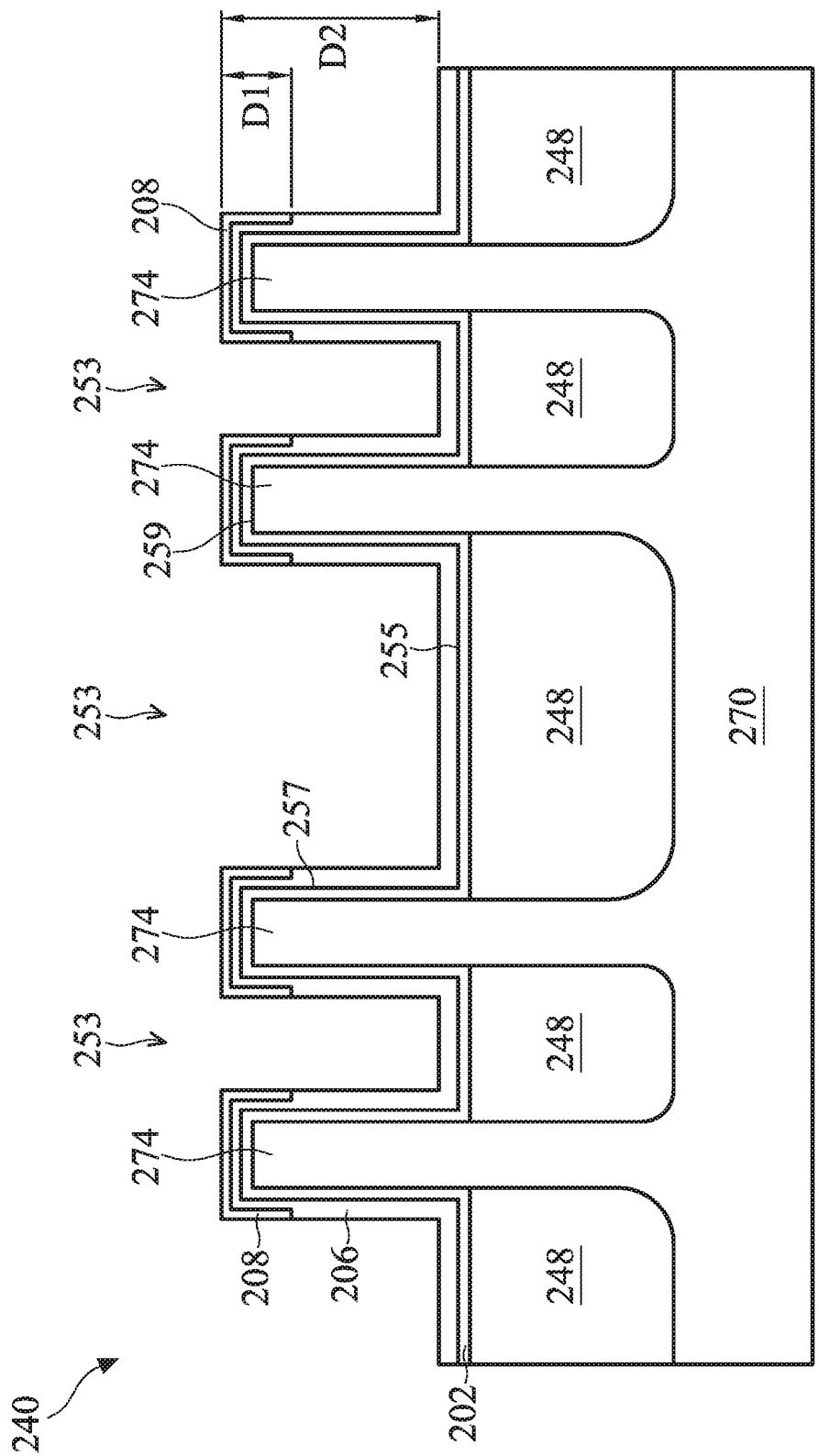

After the film deposition process 152, the dummy gate layer formation process 150 continues to the top treatment process 154 to form a passivation layer 208 at a top portion of the fins 274. The passivation layer 208 may be formed by treating the substrate surface with a treatment gas so that the passivation layer 208 is formed on the film 206 (or in the surface layer of the film 206) located at a top portion of the fins 274, as shown in FIG. 6. In some embodiments, the substrate surface may include the exposed surface of the film 206 on the interfacial dielectric layer 202 located at the top portion of the fins 274. In some embodiments, the substrate surface may include the exposed surface of the film 206 on the seed layer 204 located at the top portion of the fins 274. The top portion of the fins 274 may include a top surface 259 of the fins 274 and an upper portion of sidewall surfaces of the fins 274.

The top treatment process 154 can allow the passivation layer 208 to form primarily at the top portion of the fins 274 because the reaction of the treatment gas at the top portion of the fins 27r4 is typically faster than that at the sidewall surfaces 257, with the bottom surface 255 of the trenches being the slowest due to a high aspect ratio of the trenches. It has been observed that performing the top treatment process 154 at higher temperatures (e.g., about 350° C. or above) can promote the reaction of the treatment gas with the film 206 at the top portion of the fins 274 over the reactions at the sidewall surfaces 257 and the bottom surface 255 of the trenches. In addition, when the film 206 is exposed to the treatment gas for a short period of time, the reaction at the sidewall surfaces 257 and the bottom surface 255 can be less than the top portion of the fins 274 due to limited exposure to the treatment gas. Since the surface reaction rate is very sensitive to temperature in LPCVD, the temperature and process time of the top treatment process 154 can be adjusted so that the treatment reaction occurs selectively at the top portion of the fins 274.

During the top treatment process 154, the semiconductor substrate 270 may be maintained at a temperature in a range from about 350° C. to about 600° C., such as about 400° C. to about 55° C., for example about 420° C. to about 500° C., during the top treatment process 154. In some examples, the semiconductor substrate 270 is maintained at a temperature in a range from about 350° C. to about 450° C. during the top treatment process 154. The top treatment process 154 may be performed for a duration in a range of about 1 second to about 120 seconds, such as about 5 seconds to about 60 seconds, for example about 10 seconds to about 45 seconds.

The top treatment process 154 may be performed in the presence of the treatment gas in a processing chamber that is maintained at elevated temperatures (e.g., 350° C. or above) sufficient to dissociate the treatment gas. The treatment gas may be any gas suitable for passivating the film 206. In some embodiments, the treatment gas is a halogen-containing precursor. The halogen species chemically react with and/or passivate the exposed surface of the film 206 at the top portion of the fins 274 to form the passivation layer 208 thereon. The passivation layer 208 may be a halogen surface layer (e.g., monolayer of halogen species) or a halogen-terminated layer of the film (e.g., silicon). The halogen surface layer or halogen-terminated layer of silicon can inhibit, limit, or significantly slow down the film growth reaction over the top portion of the fins 274 during the subsequent film deposition process 156. In some embodiments, the treatment gas is a halogen precursor such as fluorine ($F_2$) or chlorine ($Cl_2$).

In some embodiments, the treatment gas is a hydrogen halide where the halogen is selected from the group consisting of fluorine, chlorine, bromine, iodine, or astatine. Suitable halogen hydride may include hydrogen bromide (HBr), hydrogen iodide (HI), hydrogen chloride (HCl), hydrogen fluoride (HF), hydrogen astatide (HAt), or any mixtures thereof. In some examples, the treatment gas is chlorine-free (e.g., HI or HBr). In some examples, the treatment gas is not a pure chlorine, halogen-containing precursor (e.g., HCl) to avoid excessive etching of the film 206 at the fin top. The top treatment process 154 can be performed in the same processing chamber as the film deposition process 152. For example, the top treatment process 154 and the film deposition process 152 can be both performed in a LPCVD reactor. If desired, the top treatment process 154 and the film deposition process 152 can be performed in different processing chambers. For example, the top treatment process 154 can be performed in a PECVD chamber while the film deposition process 152 is performed in a LPCVD reactor.

While the halogen from the treatment gas may etch a small portion of the film 206 during the top treatment process 154, some halogen-containing precursors are found to have a significant slower etch rate with amorphous silicon at high temperatures, such as 350° C. or above, for example about 400° C. or above. For example, HI or HBr can etch the film 206 over the top portion of the fins 274 at an etch rate that is 10 times slower, or even 100 times slower as compared to the treatment gas using $Cl_2$ or HF at 370° C. or below. In any cases, the halogen-containing precursor does not etch through the film 206 to expose the underlying layer (e.g., the interfacial dielectric layer 202 or the seed layer 204 if used). That is, the thickness of the film 206 etched or removed during the top treatment process 154 is generally less than the thickness of the film deposited during the film deposition process 152.

Example top treatment processes 154 includes using a LPCVD reactor to process a batch of wafers, such as the semiconductor device structure 240. Likewise, the wafers are stacked side by side and placed in a boat or cage held in the LPCVD reactor. The reactor is heated and maintained by heating elements of the LPCVD reactor at a temperature of about 350° C. or above, such as about 400° C. or above, such as about 450° C. to about 650° C., for example about 500° C. to about 550° C. The substrate surface of the semiconductor device structure 240 is exposed to, or is in the presence of a halogen-containing precursor, such as HBr, HI, HCl, $Cl_2$, or any combination thereof. In some examples, the halogen-containing precursor is HBr. In another example, the halogen-containing precursor is HI. The halogen-containing precursor may be introduced into the LPCVD reactor from a gas injector located at a sidewall of the LPCVD reactor. In some embodiments, the halogen-containing precursor is flowed from the gas injector and laterally across the substrate surface of the semiconductor device structure 240 in a laminar flow-like manner (e.g., parallel to the substrate surface) such that the substrate surface of the semiconductor device structure 240 is exposed to, or in the presence of the halogen-containing precursor. The pressure inside the reactor is maintained in a range from at about 1 Torr to about 80 Torr, such as about 4.5 Torr to about 20 Torr, for example about 10 Torr, using an exhaust pump and an adjustable exhaust valve. After the top treatment process 154, the film 206 at the top portions of the fins 274 is covered with a passivation layer having a thickness of about 2 nm or less, such about 1.5 nm or less, for example about 0.1 nm to about 1 nm.

The passivation layer 208 on the film 206 at the top portion of the fins has a sidewall surface that has a first dimension D1 that is substantially vertical (e.g., parallel to a sidewall surface of the fin 274), and the film 206 has a sidewall surface that has a second dimension D2 that is substantially vertical. The ratio of D1:D2 may vary depending upon the application and process parameters such as treatment temperature, time, and/or pressure, etc. For example, the ratio of D1:D2 may be about 1:2 or less, such as about 1:3, about 1:4, about 1:5, about 1:6, about 1:7, about 1:8, about 1:9, about 1:10, about 1:11, about 1:12, etc. In some examples, the ratio of D1:D2 is about 1:3 to about 1:10, such as about 1:4 to about 1:6, for example about 1:5. It is contemplated that the ratio of D1:D2 can be adjusted according to the sizes of respective components of the semiconductor device structure.

Figure 7:
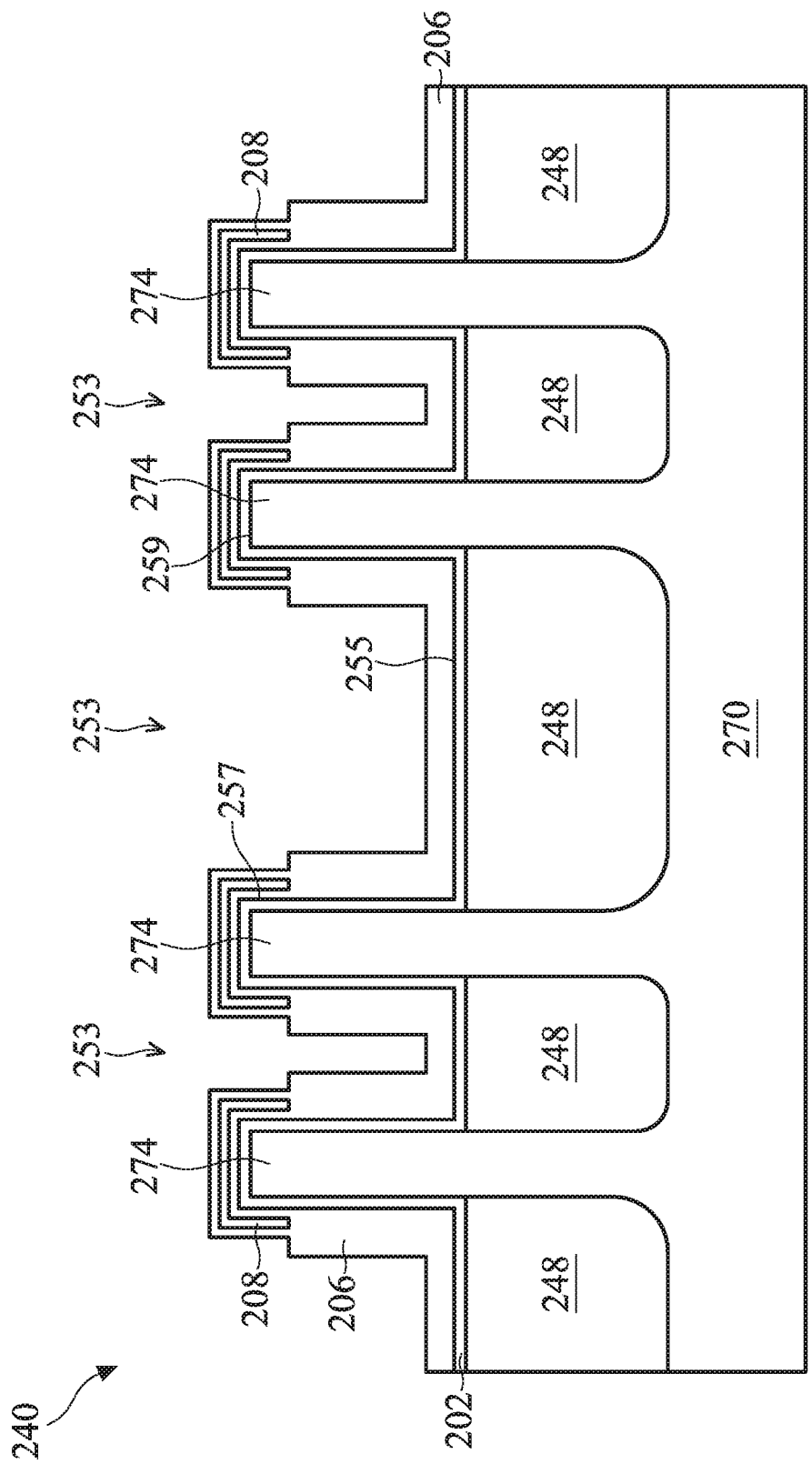

After the top treatment process 154, the dummy gate layer formation process 150 proceeds to the film deposition process 156. The film deposition process 156 can be identical to the film deposition process 152 as discussed above. The film deposition process 156 forms the new film (e.g., a-Si) on the passivation layer 208. The passivation layer 208 is thus buried under the new film once the film deposition process 156 is finished, as shown in FIG. 7. Since the passivation layer 208 limits or significantly slows down the film growth reaction on the film 206 at the top portions of the fins 274, the new film formed during the film deposition process 156 generally grows on the untreated or less treated surface of the film 206 at the bottom surface 255 and sidewall surfaces 257 of the trenches 253 at a greater rate than on the passivation layer 208 on the film 206 at the top portions of the fins 274. While the new film 206 may still form on and cover the passivation layer 208 at the top portions of the fins 274, the deposition reaction of the new film 206 generally occurs at a significant slower rate at the top portions of the fins 274 due to the presence of the passivation layer 208. The passivation layer 208 causes the new film 206 to be selectively or prominently grown on the film 206 over the bottom surface 255 and sidewall surfaces 257 of the trenches 253 not being covered by the passivation layer 208. Therefore, the film profile at the bottom surface 255 and the sidewall surfaces 257 of the trenches 253 is formed thicker than the film profile at the top portion of the fins 274, as shown in FIG. 7. For clarity, the passivation layer 208 from the top treatment process 154 is not shown in FIG. 7, although the passivation layer 208 may remain or may react with a precursor and be purged as a byproduct. Having a thinner film profile at the top portion of the fins 274 can be beneficial as it avoids the opening of the trenches 253 from merging and trap a seam or void within the trenches.

In some embodiments where the dummy gate layer formation process 150 is still going on (and the trench fill has not yet completed), the film deposition process 156 may switch back to the top treatment process 154 as soon as the new film 206 is about to form over the top portion of the fins 274, or a very limited growth of the new film 206 has been occurred over the top portion of the fins 274. A thickness-controlled or time-controlled manner may be used to help decide whether to switch from the film deposition process 156 to the top treatment process 154. In this manner, the growth of the new film 206 over the top portions of the fins 274 can be kept to a minimum. For example, the new film 206 formed over the bottom surface 255 of the trenches 253 not being covered by the passivation layer 208 may have a first thickness T1 and the new film 206 formed on the passivation layer 208 (over the top portion of the fins 274) may have a second thickness T2. The ratio of T1 to T2 during a film deposition process (e.g., film deposition process 156) may be about 10:1 or greater, such as about 30:1 or greater, for example about 60:1 or greater. In some cases, the ratio of T1 to T2 may be about 60:1 to about 80:1, or even about 100:1 or greater. The ratio of T1 to T2 can be used to determine whether the film deposition process 156 should be switched to the top treatment process 154 to minimize the growth of the new film 206 over the top portion of the fins 274. In various embodiments, the film deposition process 156 may switch to the top treatment process 154 as soon as the ratio of T1 to T2 reaches 30:1 or above, such as about 50:1 or above, for example about 100:1 or above. This switch may continue until the trench fill is completed.

After the film deposition process 156, the dummy gate layer formation process 150 proceeds to a decision box 158 to determine whether the gate formation is completed. If not, the dummy gate layer formation process 150 proceeds to perform the top treatment process 154 and the film deposition process 156 as discussed above until the dummy gate formation layer process 150 is completed. The dummy gate layer formation process 150 may be completed when the film fills the trenches 253 between fins 274 and reaches a pre-determined height over the top of fins 274. For example, the pre-determined height may be in a range from about 100 Å to about 1000 Å, such as about 150 Å to about 300 Å. It is contemplated that the pre-determined height may vary depending upon the height needed for the gate structures, e.g., gate structures 251 shown in FIGS. 15A and 15C.

Figure 8:
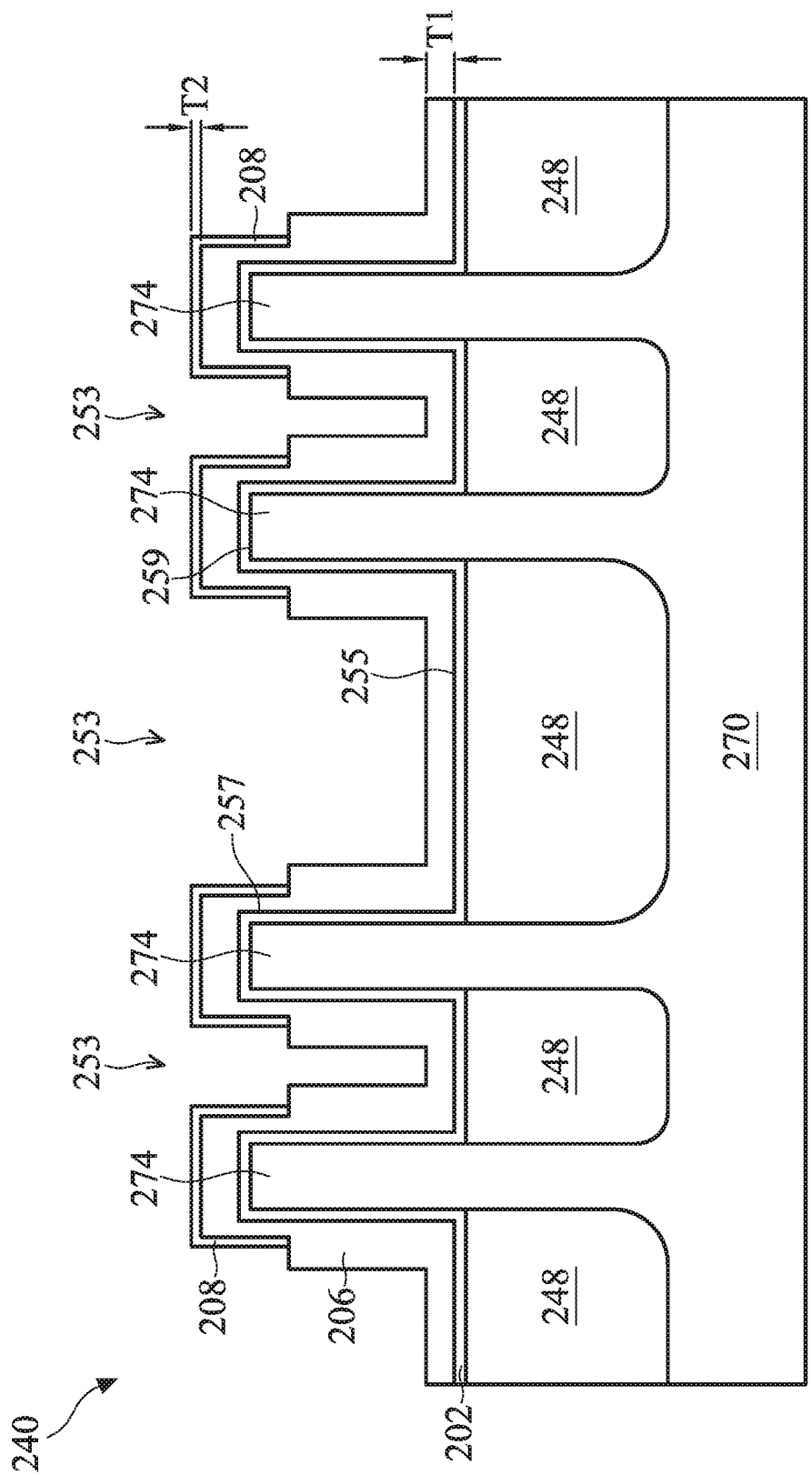
Figure 9:
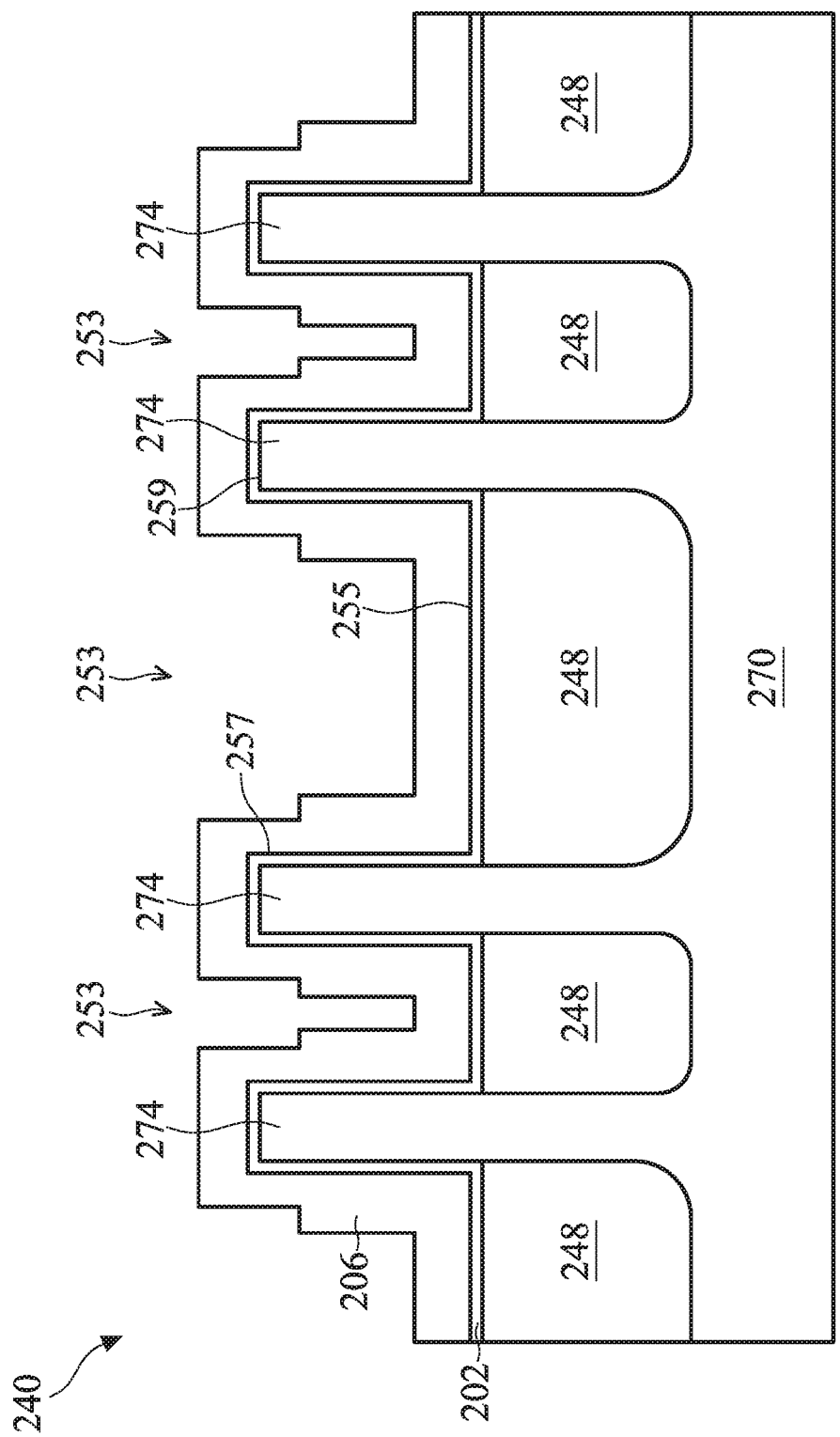

FIGS. 8 to 13 illustrate various stages of the semiconductor device structure 240 going through multiple cycles of the deposition-treatment process (e.g., processes 154, 156) according to some embodiments. For clarity, the passivation layer(s) formed from the previous top treatment processes 154 (e.g., as the passivation layer 208 shown in FIG. 7) is not shown. As can be seen, the film top treatment process 154 again passivates the exposed surface of the film 206 at the top portion of the fins 274 formed during the previous film deposition process to form a passivation layer 208 thereon, as shown in FIG. 8. Thereafter, the film deposition process 156 is performed to form the new film 206 preferentially or selectively on the untreated or less treated surface of the film 206 over the bottom surface 255 and sidewall surfaces 257 of the trenches 253, as shown in FIG. 9. Due to the presence of the passivation layer 208, the deposition reaction would occur at a slower rate at the top portions of the fins 274, resulting in a thicker film profile at the bottom surface 255 and the sidewall surfaces 257 of the trenches 253 than the film profile at the top portion of the fins 274, as shown in FIG. 9.

Figure 10:
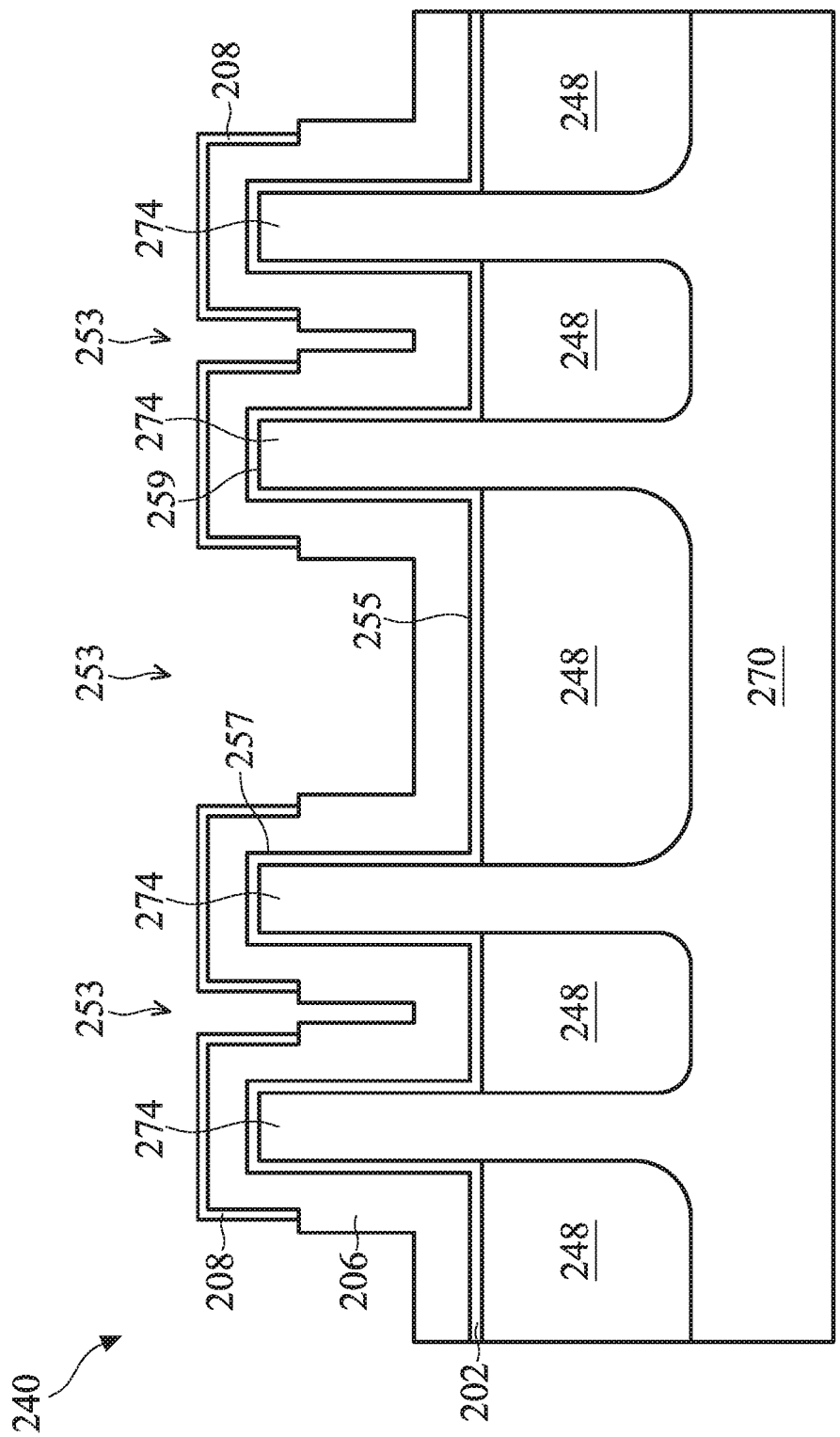
Figure 11:
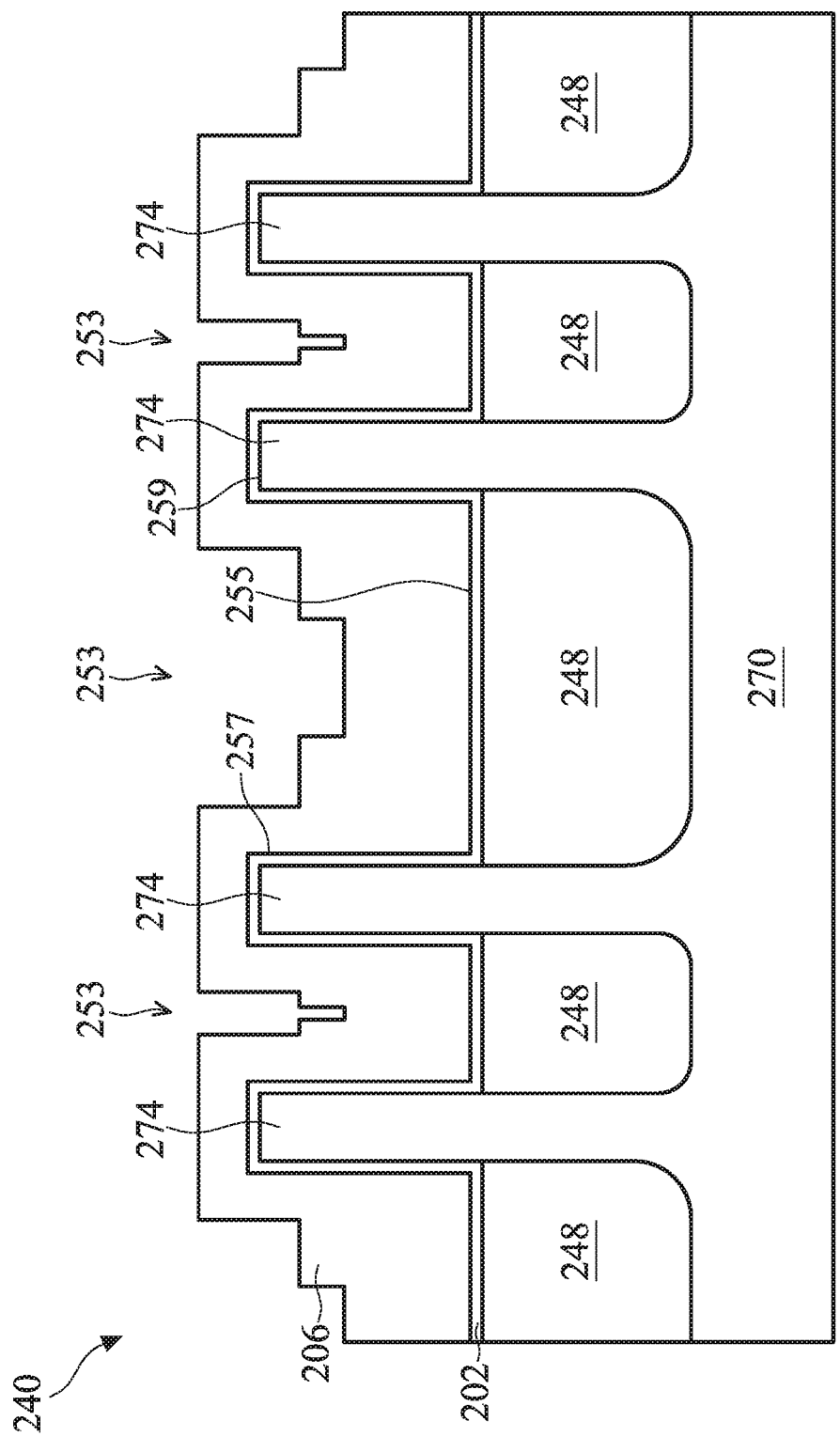

FIGS. 10 and 11 illustrate the semiconductor device structure 240 going through another cycle of deposition-treatment process (e.g., processes 154, 156). As can be seen, the film top treatment process 154 again passivates the exposed surface of the film 206 at the top portion of the fins 274 formed during the previous film deposition process to form a passivation layer 208 thereon, as shown in FIG. 10. Thereafter, the film deposition process 156 is performed to preferentially or selectively form the new film 206 on the untreated or less treated surface of the film 206 over the bottom surface 255 and sidewall surfaces 257 of the trenches 253. Likewise, due to the presence of the passivation layer 208, the deposition reaction would result in a thicker film profile at the bottom surface 255 and the sidewall surfaces 257 of the trenches 253 than the film profile at the top portion of the fins 274, as shown in FIG. 11. After this cycle of the deposition-treatment process, the edge of the new film 206 is moved away from the bottom surface 255 and the sidewall surfaces 257 of the trenches 253 as compared to the state in the previous cycle (FIG. 9). At the same time, the thickness of the film 206 at the top portion of the fins 274 remains thin and thus it can avoid the opening of the trenches 253 from pinching off and trap a seam or void within the trenches.

Figure 12:
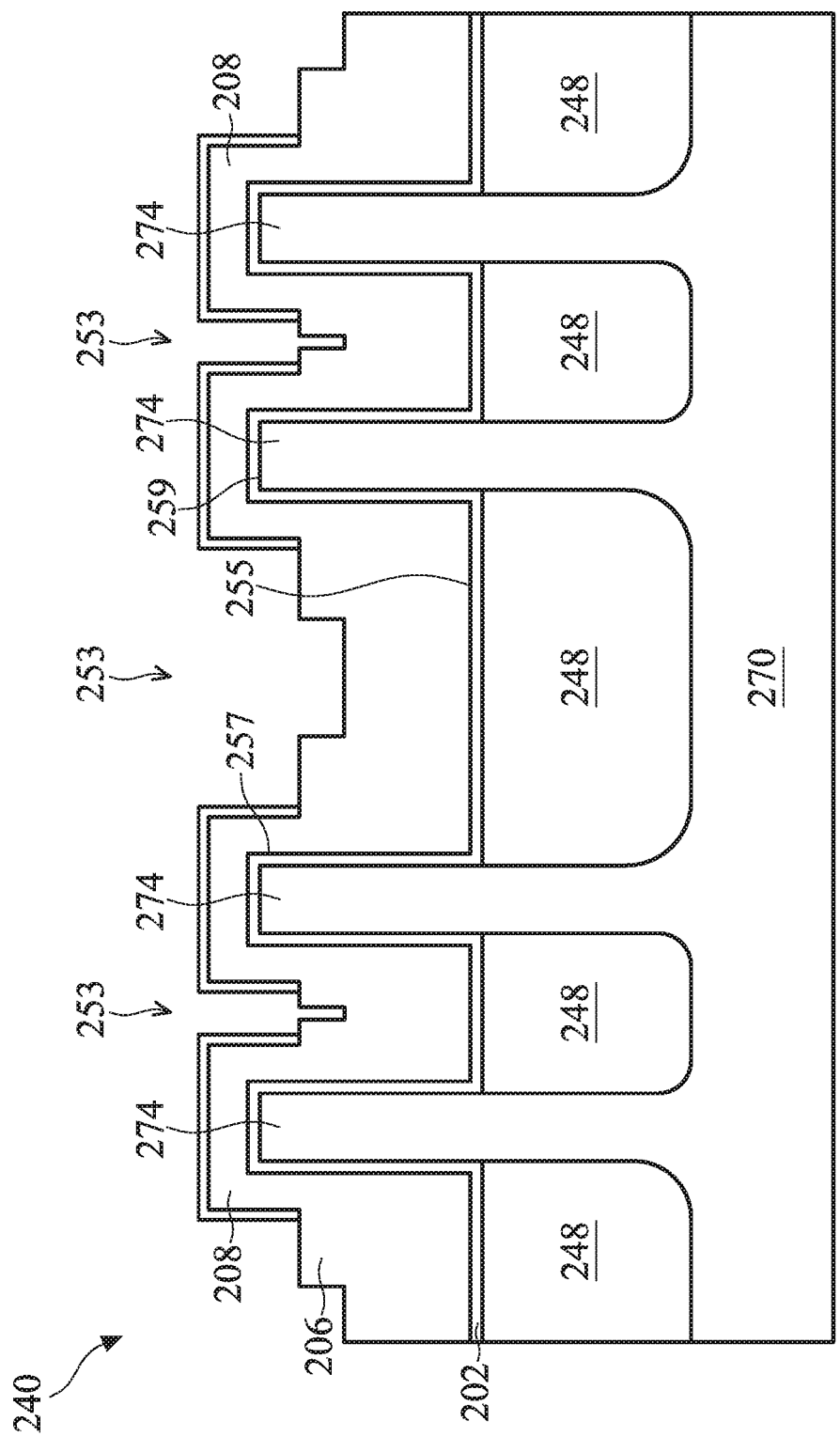
Figure 13:
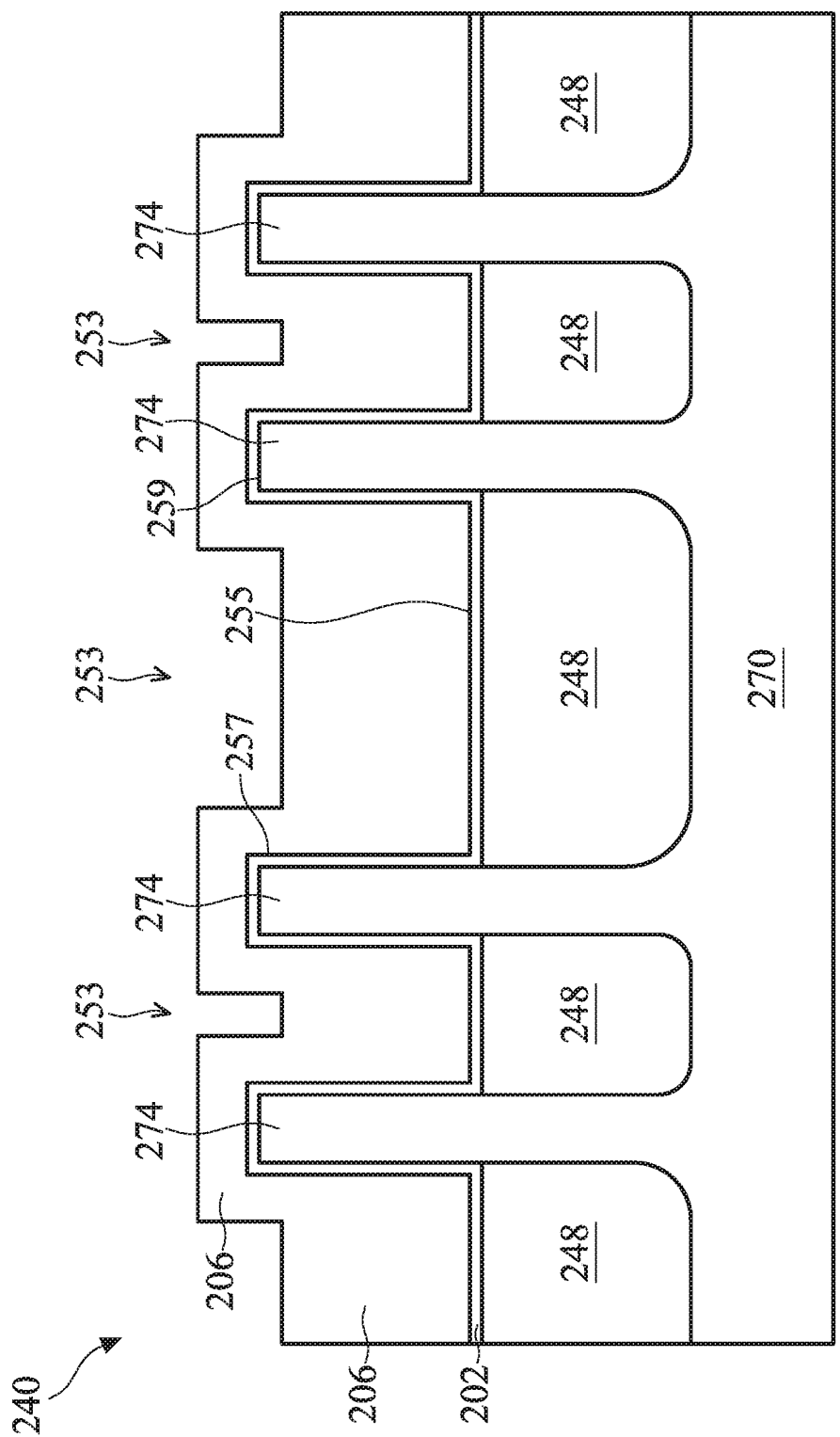

FIGS. 12 and 13 illustrate the semiconductor device structure 240 going through yet another cycle of deposition-treatment process (e.g., processes 154, 156). As can be seen, the film top treatment process 154 again passivates the exposed surface of the film 206 at the top portion of the fins 274 formed during the previous film deposition process to form a passivation layer 208 thereon, as shown in FIG. 12. Thereafter, the film deposition process 156 is performed to preferentially or selectively form the new film 206 on the untreated or less treated surface of the film 206 over the bottom surface 255 and sidewall surfaces 257 of the trenches 253, resulting in a thicker film profile at the bottom surface 255 and the sidewall surfaces 257 of the trenches 253 than the film profile at the top portion of the fins 274. After this cycle of the deposition-treatment process, the film 206 grown along the sidewall surfaces 257 of the trenches 253 between neighboring fins 274 may have been merged or contacted to each other, as shown in FIG. 13. The film 206 over the top portion of neighboring fins 274, however, remains un-merged due to the presence of the passivation layer 208. The edge of the new film 206 is moved further away from the bottom surface 255 of the trenches 253 as compared to the previous cycle (FIG. 11). In addition, the thickness of the film 206 at the top portion of the fins 274 still remains thin and thus it can avoid the opening of the trenches 253 from pinching off prematurely and trap a seam or void within the trenches.

Figure 14A:
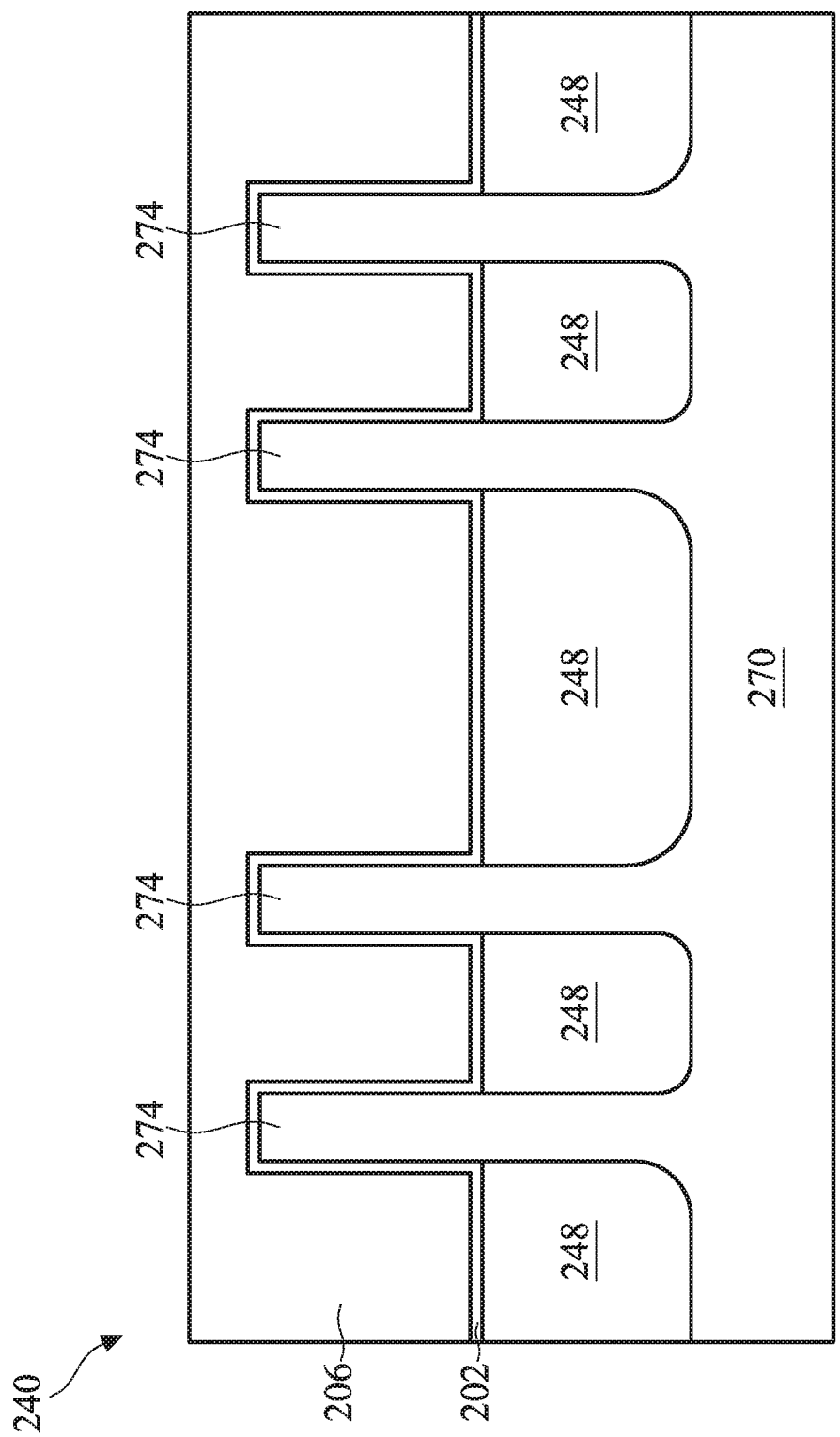
Figure 14B:
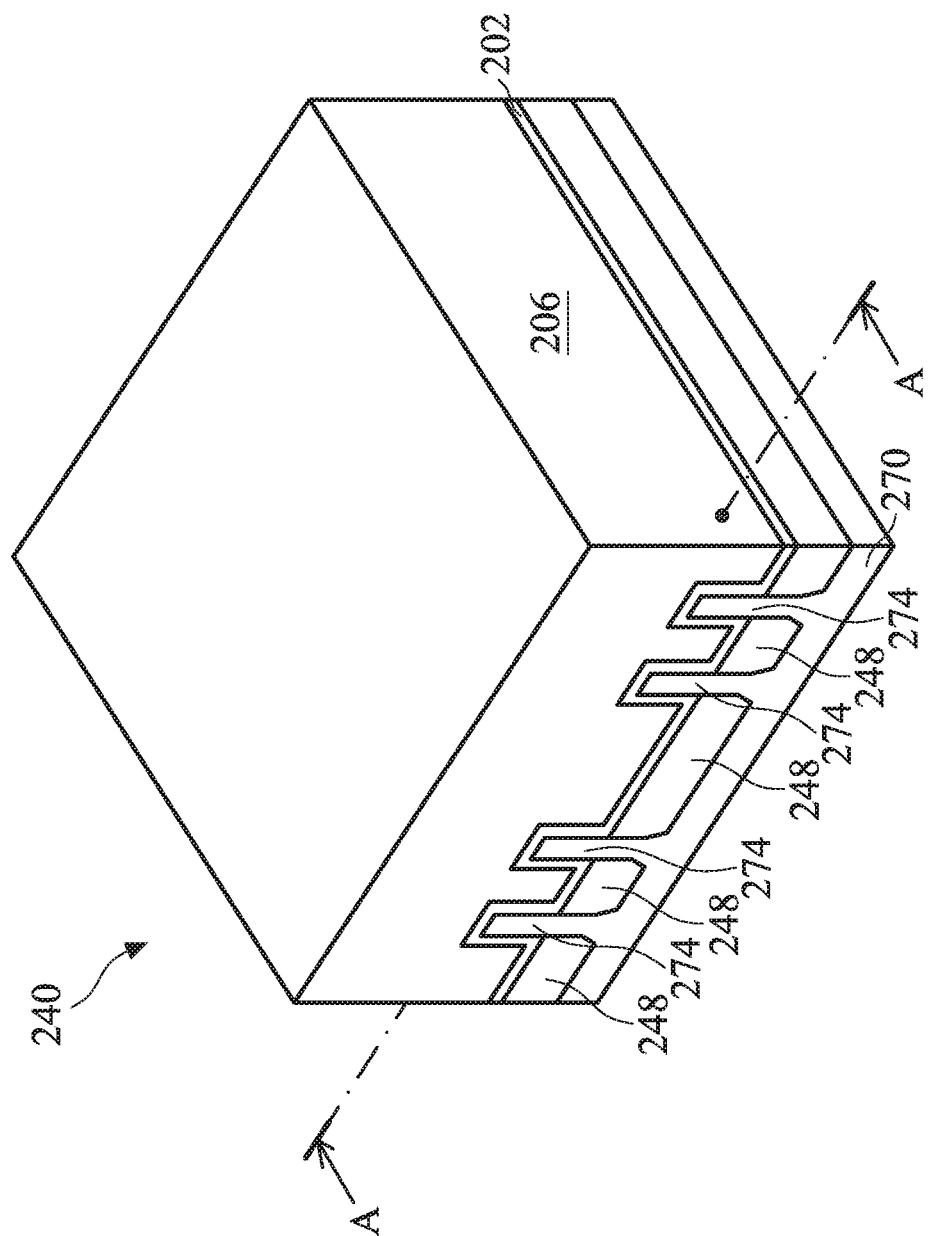

FIG. 14A illustrates the trenches 253 between neighboring fins 274 have been completely filled with substantially no seam or void (e.g., a seam and/or void takes up less than about 1% of the volume of the trenches 253) after a suitable number of sequences or cycles of the deposition-treatment processes. The deposition process (e.g., the film deposition process 152, 156) may be performed to continue the deposition of the film 206 over the substrate surface until a pre-determined height is reached. FIG. 14B illustrates a three-dimensional view of the semiconductor device structure 240 of FIG. 14A where the dummy gate layer (i.e., the film 206) has been formed over the substrate surface according to some embodiments. After the dummy gate layer is formed and the trenches are filled, the flow chart 100 may proceed to operation 108, as will be discussed below in more detail. In some examples, the film 206 may be planarized, such as by a chemical mechanical planarization (CMP), to form a top surface of the film 206 to be planar.

While the dummy gate layer material using silicon is discussed, the concept described herein is equally applicable to other materials such as silicon germanium ($Si_xGe_{1-x}$, where x can be between approximately 0 and 1), silicon carbide, silicon phosphorus, silicon carbon phosphorus, germanium, a III-V compound semiconductor, a II-VI compound semiconductor, or the like. In cases where silicon germanium is desired, a germanium-containing precursor (e.g., $GeH_4$, $Ge_2H_6$, etc.) or a halogenated germanium precursor (e.g., $GeCl_4$, $GeHCl_3$, $Ge_2Cl_6$, $Ge_3Cl_6$, etc.) may be used in conjunction with any of the silicon-containing precursors in a similar fashion as discussed above in FIG. 2 to fill the trenches, such as the trenches 253.

Figures 15A, 15B:
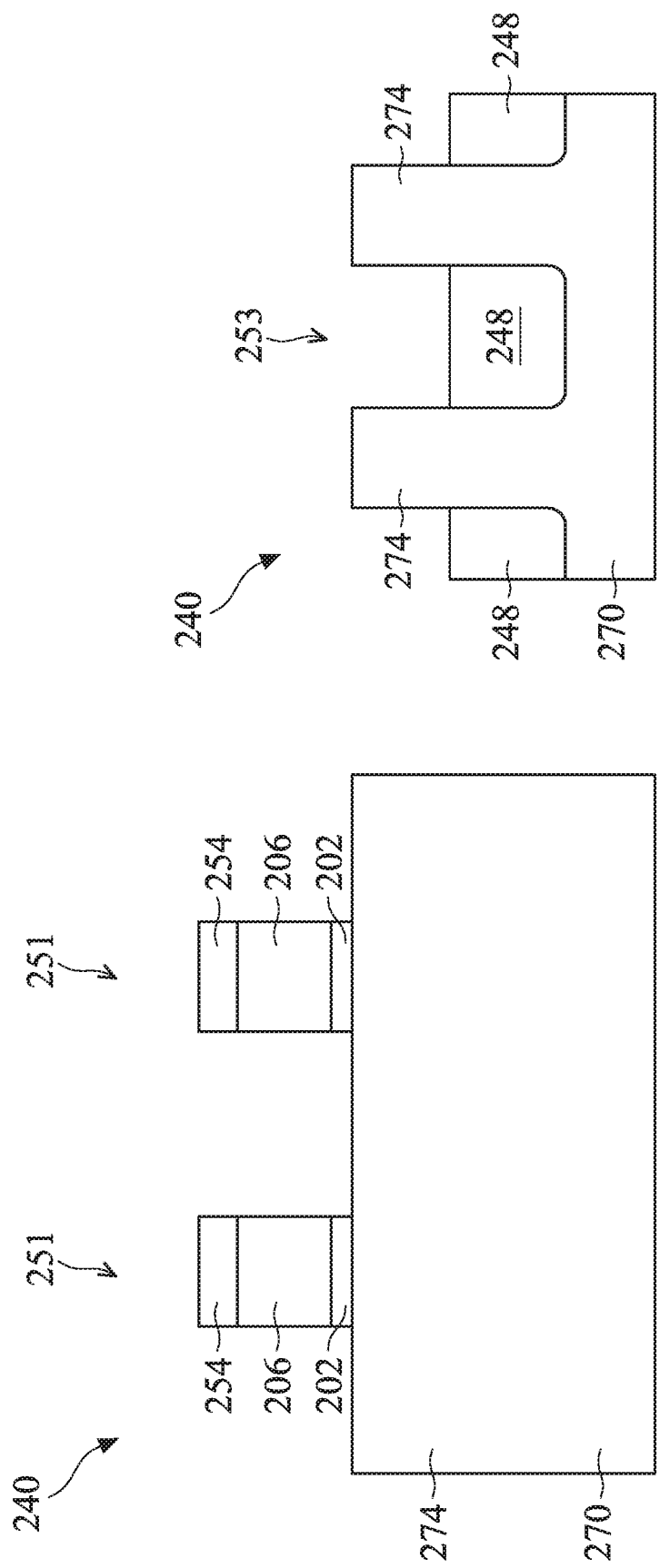
Figure 15C:
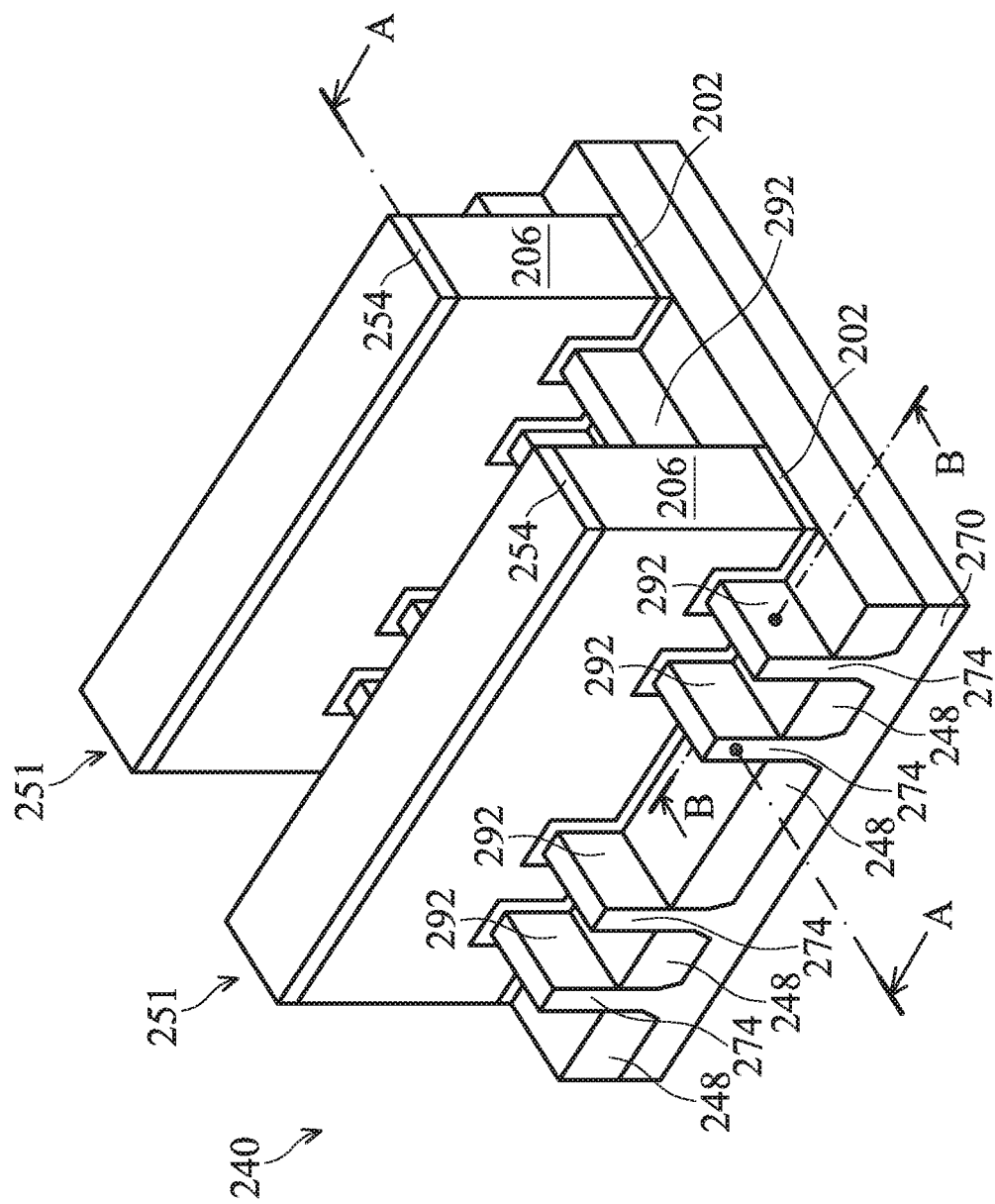

At operation 108, and with reference to FIGS. 15A, 15B, and 15C, a mask 254 is formed over the dummy gate layer (i.e., film 206) and the mask 254, dummy gate layer, and interfacial dielectric layer 202 (and seed layer 204 if used) may then be patterned, for example, using photolithography and one or more etch processes to form the mask 254, dummy gate layer (i.e., the film 206), and interfacial dielectric layer 202 for each gate structure, e.g., gate structure 251, as shown in FIGS. 15A and 15C. The mask 254 may include or be silicon nitride, silicon oxynitride, silicon carbon nitride, the like, or a combination thereof, deposited by CVD, PVD, ALD, or any suitable deposition technique. Particularly, the gate structures 251 are over and extend perpendicularly to the fins 274.

FIG. 15C further illustrates reference cross-sections. Cross-section A-A is in a plane along, e.g., channels in the fin 274 between opposing source/drain regions 292. Cross-section B-B is in a plane perpendicular to cross-section A-A and is across source/drain regions 292 in two neighboring fins 274. Cross-section B-B of FIG. 15C corresponds to a portion of the cross-section A-A of FIG. 3; a person having ordinary skill in the art will readily understand how processing of the cross-section B-B of FIG. 15C can be extrapolated to the cross-section A-A of FIG. 3. FIG. 15A and following figures ending with an "A" designation illustrate cross-sectional views at various instances of processing corresponding to cross-section A-A of FIG. 15C, and FIG. 15B and following figures ending with a "B" designation illustrate cross-section views at various instances of processing corresponding to cross-section B-B of FIG. 15C.

At operation 110, and with reference to FIGS. 16A and 16B, gate spacers 286 are formed along sidewalls of the gate structures 251 (e.g., sidewalls of the gate interfacial dielectric layer 202, dummy gate layer (i.e., the film 206), and mask 254) and over the fins 274. The gate spacers 286 may be formed by conformally depositing one or more layers for the gate spacers 286 and anisotropically etching the one or more layers, for example. The one or more layers for the gate spacers 286 may include a material different from the material(s) for the gate structure 251. In some embodiments, the gate spacer 286 may include or be a dielectric material, such as silicon oxygen carbide, silicon nitride, silicon oxynitride, silicon carbon nitride, the like, multi-layers thereof, or a combination thereof, and may be deposited by any suitable deposition technique. An anisotropic etching process is then performed to remove portions of the spacer layers to form the gate spacers 286, as depicted in FIGS. 16A and 16B.

After the gate spacers 286 are formed, source/drain regions 292 may be formed in the fins 274, as depicted in FIGS. 16A and 16B. In some examples, recesses can be etched in the fins 274 using the gate structures 251 and gate spacers 286 as masks (such that recesses are formed on opposing sides of the gate structures 251), and a material may be epitaxially grown in the recesses to form the source/drain regions 292. Additionally or alternatively, the source/drain regions 292 may be formed by implanting dopants into the fins 274 and/or the epitaxial source/drain regions 292 using the gate structures 251 as masks (such that the source/drain regions are formed on opposing sides of the gate structures 251).

Depending on the conductivity type of the transistor, the material for the source/drain regions 292 may be chosen to include or be silicon germanium, silicon carbide, silicon phosphorus, silicon carbon phosphorus, pure or substantially pure germanium, a III-V compound semiconductor, a II-VI compound semiconductor, or the like. The source/drain regions 292 may be raised with respect to the fins 274 and may have facets, which may correspond to crystalline planes of the semiconductor substrate 270.

An optional contact etch stop layer (CESL) 296 and a first interlayer dielectric (ILD) 297 are sequentially formed on surfaces of the source/drain regions 292, sidewalls and top surfaces of the gate spacers 286, top surfaces of the masks 254, and top surfaces of the isolation regions 248 using any suitable deposition technique. The CESL 296 is deposited conformally and may include or be silicon nitride, silicon carbon nitride, silicon carbon oxide, carbon nitride, the like, or a combination thereof. The first ILD 297 may include or be tetraethylorthosilicate (TEOS) oxide, silicon dioxide, a low-k dielectric material (e.g., a material having a dielectric constant lower than silicon dioxide). A CMP process may then be performed to planarize the first ILD 297 and the CESL 296 and to remove the masks 284 of the gate structures 251, thereby leveling the top surface of the first ILD 297 and CESL 296 with the top surfaces of the dummy gate layers (i.e., the film 206).

At operation 112, and with reference to FIGS. 16A and 16B, the dummy gate structures 251 are removed and replacement gate structures 228a, 228b are formed where the dummy gate structures 251 were removed. The gate structures 251 can be removed using one or more etch processes. Upon removal of the gate structures 251, recesses are formed between the gate spacers 286 where the gate stacks are removed, and channel regions of the fins 274 are exposed through the recesses. The replacement gate structures 228a, 228b are then formed in the recesses where the gate structures 251 were removed. The replacement gate structures 228a, 228b each may include, as illustrated in FIG. 17A, an interfacial dielectric 220, a gate dielectric layer 222, one or more optional conformal layers 224, and a gate conductive fill material 226. The interfacial dielectric 220 is formed on top surfaces of the fins 274 along the channel regions. The interfacial dielectric 220 can be an oxide (e.g., silicon oxide) formed by thermal or chemical oxidation of the fin 274, and/or an oxide (e.g., silicon oxide), nitride (e.g., silicon nitride), and/or another dielectric layer using any suitable deposition technique.

The gate dielectric layer 222 can be conformally deposited in the recesses where gate stacks were removed (e.g., on the interfacial dielectric 220, and sidewalls of the gate spacers 286) and on the top surfaces of the first ILD 297, the CESL 296, and gate spacers 286. The gate dielectric layer 222 can be or include silicon oxide, silicon nitride, a high-k dielectric material, multilayers thereof, or other dielectric material. A high-k dielectric material may have a k value greater than about 4.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 224 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A layer for the gate conductive fill material 226 is formed over the one or more conformal layers 224, if implemented, and/or the gate dielectric layer 222. The layer for the gate conductive fill material 226 can fill remaining recesses where the gate stacks were removed. The layer for the gate conductive fill material 226 may be or include a metal-containing material such as tungsten, cobalt, aluminum, ruthenium, copper, multi-layers thereof, a combination thereof, or the like.

A planarization process, like a CMP, may remove portions of the layer for the gate conductive fill material 226, one or more conformal layers 224, and gate dielectric layer 222 above the top surfaces of the first ILD 297, the CESL 296, and gate spacers 286. The replacement gate structures 228 including the gate conductive fill material 226, one or more conformal layers 224, gate dielectric layer 222, and interfacial dielectric 220 may therefore be formed as illustrated in FIG. 17A.

A second ILD 230 is formed over the gate conductive fill material 226, one or more conformal layers 224, and gate dielectric layer 222, first ILD 297, gate spacers 286, and CESL 296, as shown in FIGS. 18A and 18B. The second ILD 230 may include or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

After the second ILD 230 is formed, source/drain contact openings are formed through the second ILD 230, the first ILD 297, and the CESL 296 to the source/drain regions 292 to expose at least portions of the source/drain regions 292. The second ILD 230, the first ILD 297, and the CESL 296 may be patterned with the openings, for example, using photolithography and one or more etch processes, such as a dry etch or any suitable anisotropic etch process. The source/drain contact openings allow making electrical contact to the source/drain regions 292 for the transistors.

After the formation of the source/drain contact openings, conductive features are formed in the openings to the source/drain regions 292. The conductive features may include a silicide region 214 formed on the source/drain regions 292, a barrier layer 219, and a conductive material 221 on the barrier layer 219. The silicide region 214 may be formed by thermally reacting an upper portion of the source/drain regions 292 with a metal layer (not shown), such as titanium, tantalum, or the like, formed on the source/drain regions 292. The barrier layer 219 is conformally deposited in the source/drain contact openings on the silicide layer 214 and over the second ILD 230, the first ILD 297, and the CESL 296, as shown in FIGS. 18A and 18B. The barrier layer 219 may be or include titanium nitride, titanium oxide, tantalum nitride, tantalum oxide, any suitable transition metal nitrides or oxides, the like, or any combination thereof, and may be deposited by ALD, CVD, PECVD, HDP-CVD, low-pressure CVD (LPCVD), or physical vapor deposition (PVD), or any suitable deposition technique. The conductive material 221 may be or include cobalt, tungsten, copper, ruthenium, aluminum, gold, silver, alloys thereof, the like, or a combination thereof, and may be deposited by CVD, ALD, PVD, ECP or any suitable deposition technique. After the conductive material 221 is deposited, excess conductive material 221 and barrier layer 219 may be removed by using a planarization process, such as a CMP. The planarization process may remove excess conductive material 221 and barrier layer 219 from above a top surface of the first ILD 297. Hence, top surfaces of the conductive material 221, the barrier layer 219, and the first ILD 297 may be coplanar. The conductive features may be referred to as contacts, plugs, etc.

Various embodiments described herein may offer several advantages. It will be understood that not all advantages have been necessarily described herein, no particular advantage is required for any embodiment, and other embodiments may offer different advantages. As an example, embodiments described herein include improved gate formation methods for forming a gate layer (e.g., a-Si) in high aspect ratio trenches using a cyclic deposition-treatment process in a LPCVD reactor. The cyclic deposition-treatment process deposits a film layer in the trenches defined between neighboring fins and treating the film layer at the tops and/or top sidewall of the fins with a halogen-containing treatment gas at a temperature of 350° C. or above so that the film growth at the top and/or top sidewall of the fins is reduced, inhibited, or minimized during the subsequent deposition stage of the cyclic process. Since the film growth at the top and/or top sidewall of the fins is reduced, the subsequent film can be selectively grown from the trench bottom and thus can prevent the opening of the trenches from pinching off prematurely and trap a seam or void within the trenches. Therefore, a bottom up filling can be achieved in a seam-free or void-free fashion.

In an embodiment, a method for semiconductor process is provided. The method includes subjecting a substrate surface having at least one feature to a film deposition process to form a conformal film over a bottom surface and along sidewall surfaces of the feature, subjecting the substrate surface to a treatment process to form respective halogen surface layers or respective halogen-terminated layers on the conformal film formed at respective upper portions of the sidewall surfaces, and performing sequentially and repeatedly the film deposition process and the treatment process to fill the feature with the film.

In another embodiment, the method includes forming fins on a substrate, sidewalls of the fins and a bottom surface defining a trench therebetween, filling the trench with a gate layer comprising performing a cyclic deposition-treatment process on the substrate in a processing chamber, and after the trenches are filled with the gate layer, patterning the gate layer to form a gate structure over the fins. The cyclic deposition-treatment process includes forming a first portion of the gate layer in the trench and along the sidewalls of the fins, forming respective passivation layers on the first portion of the gate layer formed at respective top portions of the fins, and forming a second portion of the gate layer on the first portion of the gate layer not covered by the passivation layer.

In one another embodiment, a method is provided. The method includes forming fins on a substrate, sidewalls of the fins and a bottom surface defining a trench therebetween, forming a dummy gate layer over the fins, and after forming the dummy gate layer, patterning the dummy gate layer to form a gate structure over the fins, wherein forming the dummy gate layer over the fins includes introducing a deposition gas, in a first deposition process, into a processing chamber in which the substrate is disposed to form a first portion of the dummy gate layer in the trench and over the fins, after introducing the deposition gas in the first deposition process, introducing a treatment gas into the processing chamber at a temperature of 350° C. or above to form respective passivation layers on the first portion of the dummy gate layer at respective top portions of the fins, after introducing the treatment gas, introducing the deposition gas, in a second deposition process, into the processing chamber to form a second portion of the dummy gate layer on the first portion of the dummy gate layer not covered by the respective passivation layers, the dummy gate layer formed at the respective top portions of the fins having a first thickness T1, and the dummy gate layer at a bottom of the trench having a second thickness T2, and after introducing the deposition gas in the second deposition process, switching the deposition gas to the treatment gas when the ratio of T1 to T2 reaches 30:1 or above.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor process, the method comprising:
   forming fins on a substrate, sidewalls of the fins and a bottom surface defining a trench therebetween;
   filling the trench with a gate layer comprising performing a cyclic deposition-treatment process on the substrate in a processing chamber, the cyclic deposition-treatment process comprising:
      forming a first portion of the gate layer in the trench and along the sidewalls of the fins;
      forming respective passivation layers on the first portion of the gate layer formed at respective top portions of the fins; and
      forming a second portion of the gate layer on the first portion of the gate layer not covered by the passivation layer; and
   after the trenches are filled with the gate layer, patterning the gate layer to form a gate structure over the fins.

2. The method of claim 1, wherein the gate layer is amorphous silicon.

3. The method of claim 1, wherein the passivation layers are formed by exposing the substrate to a treatment gas comprising a halogen-containing precursor.

4. The method of claim 3, wherein the halogen-containing precursor is a halogen hydride.

5. The method of claim 3, wherein the halogen-containing precursor comprises hydrogen iodide (HI), hydrogen bromide (HBr), hydrogen chloride, or a combination thereof.

6. The method of claim 1, wherein the substrate is at a temperature of 350° C. or above and a chamber pressure is in a range from 1 Torr to 80 Torr while exposing the substrate to a treatment gas.

7. The method of claim 1, wherein the processing chamber is a low-pressure chemical vapor deposition (LPCVD) chamber.

8. A method for semiconductor process, the method comprising:
   forming fins on a substrate, sidewalls of the fins and a bottom surface defining a trench therebetween;
   forming a dummy gate layer over the fins, comprising:
      introducing a deposition gas, in a first deposition process, into a processing chamber in which the substrate is disposed to form a first portion of the dummy gate layer in the trench and over the fins;
      after introducing the deposition gas in the first deposition process, introducing a treatment gas into the processing chamber at a temperature of 350° C. or above to form respective passivation layers on the first portion of the dummy gate layer at respective top portions of the fins;
      after introducing the treatment gas, introducing the deposition gas, in a second deposition process, into the processing chamber to form a second portion of the dummy gate layer on the first portion of the dummy gate layer not covered by the respective passivation layers, the dummy gate layer formed at the respective top portions of the fins having a first thickness T1, and the dummy gate layer at a bottom of the trench having a second thickness T2; and
      after introducing the deposition gas in the second deposition process, switching the deposition gas to the treatment gas when the ratio of T1 to T2 reaches 30:1 or above; and
   after forming the dummy gate layer, patterning the dummy gate layer to form a gate structure over the fins.

9. The method of claim 8, wherein the dummy gate layer is amorphous silicon.

10. The method of claim 8, wherein the treatment gas comprises a halogen hydride.

11. The method of claim 8, wherein the halogen-containing precursor comprises hydrogen iodide (HI), hydrogen bromide (HBr), or a combination thereof.

12. The method of claim 8, wherein the processing chamber is a low-pressure chemical vapor deposition (LP-CVD) chamber.

13. A method for semiconductor process, the method comprising:
   forming a first fin and a second fin on a substrate, a first sidewall of the first fin and a second sidewall of the second fin forming sidewalls of a trench; and
   performing a cyclic deposition-treatment process to form a layer in the trench, the cyclic deposition-treatment process comprising:
      forming a first portion of the layer along a bottom and the sidewalls of the trench, the layer extending over the first fin and the second fin; and
      forming a first passivation layer on the first portion of the layer on an upper surface of the first fin and the first portion of the layer on an upper surface of the second fin, wherein the first portion of the first layer along a bottom of the trench is free of the first passivation layer; and
      forming a second portion of the layer along the bottom and the sidewalls of the trench, the second portion of the layer extending over the first passivation layer.

14. The method of claim 13, further comprising:
   forming a second passivation layer on the second portion of the layer on the upper surface of the first fin and the second portion of the layer on the upper surface of the second fin, wherein the second portion of the first layer along the bottom of the trench is free of the second passivation layer.

15. The method of claim 13, wherein the layer comprises amorphous silicon or polysilicon.

16. The method of claim 15, wherein forming the first passivation layer comprises exposing the layer to a halogen-containing precursor.

17. The method of claim 16, wherein the halogen-containing precursor comprises hydrogen bromide (HBr), hydrogen iodide (HI), or hydrogen chloride (HCl).

18. The method of claim 13, wherein a ratio of a first vertical height of the first passivation layer to a second vertical height of a sidewall of the first portion of the layer is in a range from 1:3 to 1:10.

19. The method of claim 13, wherein forming the first portion of the layer comprises conformally depositing the first portion of the layer.

20. The method of claim 13, wherein the forming the first portion of the layer and forming the first passivation layer is performed in a same processing chamber, and further comprising purging the same processing chamber after forming the first portion and prior to forming the first passivation layer.

* * * * *